United States Patent
Matsui et al.

(10) Patent No.: US 10,591,555 B2
(45) Date of Patent: Mar. 17, 2020

(54) MAGNETIC SENSOR DEVICE

(71) Applicant: Mitsubishi Electric Corporation, Chiyoda-ku (JP)

(72) Inventors: Hideki Matsui, Chiyoda-ku (JP); Tomokazu Ogomi, Chiyoda-ku (JP); Masaaki Okada, Chiyoda-ku (JP); Kenji Shimohata, Chiyoda-ku (JP); Sadaaki Yoshioka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/078,604

(22) PCT Filed: Mar. 14, 2017

(86) PCT No.: PCT/JP2017/010185
§ 371 (c)(1),
(2) Date: Aug. 21, 2018

(87) PCT Pub. No.: WO2017/169740
PCT Pub. Date: Oct. 5, 2017

(65) Prior Publication Data
US 2019/0056461 A1    Feb. 21, 2019

(30) Foreign Application Priority Data
Mar. 30, 2016    (JP) .................. 2016-067885

(51) Int. Cl.
*G01R 33/09*      (2006.01)
*G07D 7/04*       (2016.01)
(Continued)

(52) U.S. Cl.
CPC ........... *G01R 33/091* (2013.01); *G01R 33/02* (2013.01); *G01R 33/09* (2013.01); *G07D 7/00* (2013.01); *G07D 7/04* (2013.01)

(58) Field of Classification Search
CPC ...... G01R 33/02; G01R 33/09; G01R 33/091; G07D 7/00; G07D 7/004
(Continued)

(56) References Cited

U.S. PATENT DOCUMENTS 4,117,523 A * 9/1978 Masuda ................. G06K 7/087
                                                  324/252
4,765,180 A * 8/1988 Clifton ................... G01N 11/14
                                                  73/54.33
(Continued)

FOREIGN PATENT DOCUMENTS

EP    2 816 368 A1    12/2014
JP    62-68260 U      4/1987
(Continued)

OTHER PUBLICATIONS

Office Action issued in Japanese Patent Application No. 2017-549529 (w/English-language translation). 7 pgs.
(Continued)

*Primary Examiner* — Patrick Assouad
*Assistant Examiner* — Demetrius R Pretlow
(74) *Attorney, Agent, or Firm* — Oblon, McClelland, Maier & Neustadt, L.L.P.

(57) ABSTRACT

A magnetic sensor device includes: a magnet; a magnetic-resistance-effect-element mounted substrate on which a magnetic-resistance-effect-element mounted body is mounted on a surface thereof opposite to a surface thereof facing the magnet, the magnetic-resistance-effect-element mounted body extending in the longitudinal direction of the magnet; a case that accommodates or retains the magnet and the magnetic-resistance-effect-element mounted substrate; and a magnetic shield that covers the case except for the surface of the magnetic-resistance-effect-element mounted substrate on which is mounted the magnetic-resistance-
(Continued)

effect-element mounted body. The magnetic shield covers the case at a position corresponding to the surface of the magnetic-resistance-effect-element mounted substrate facing the magnet, or from the position corresponding to the surface of the magnetic-resistance-effect-element mounted substrate facing the magnet to a side of the case opposite to the magnet.

17 Claims, 25 Drawing Sheets

(51) Int. Cl.
*G07D 7/00* (2016.01)
*G01R 33/02* (2006.01)

(58) Field of Classification Search
USPC .......................................................... 324/288
See application file for complete search history.

(56) References Cited

U.S. PATENT DOCUMENTS

| | | | | |
|---|---|---|---|---|
| 5,450,009 | A * | 9/1995 | Murakami | G01D 5/147 324/207.21 |
| 5,570,015 | A * | 10/1996 | Takaishi | G01B 7/02 137/554 |
| 5,637,995 | A * | 6/1997 | Izawa | G01D 5/145 324/174 |
| 9,664,533 | B2 | 5/2017 | Asano et al. | |
| 2002/0024337 | A1 * | 2/2002 | Levert | G01N 27/725 324/235 |
| 2003/0030522 | A1 * | 2/2003 | Kasashima | H03K 17/97 335/205 |
| 2003/0122641 | A1 * | 7/2003 | Luetzow | G01D 5/145 335/205 |
| 2007/0024280 | A1 * | 2/2007 | Meyersweissflog | G01D 5/145 324/252 |
| 2009/0152356 | A1 * | 6/2009 | Reddy | G06K 9/186 235/449 |
| 2011/0227563 | A1 * | 9/2011 | Akahane | G01D 5/145 324/207.25 |
| 2013/0249029 | A1 * | 9/2013 | Vig | G01R 33/0047 257/427 |
| 2013/0249544 | A1 * | 9/2013 | Vig | G01R 33/0011 324/252 |
| 2014/0028308 | A1 * | 1/2014 | Ogomi | G01R 33/096 324/252 |
| 2015/0377650 | A1 | 12/2015 | Asano et al. | |
| 2016/0146635 | A1 * | 5/2016 | Sato | G01D 5/145 324/207.22 |
| 2016/0217894 | A1 * | 7/2016 | Ausserlechner | G01P 3/487 |
| 2017/0154487 | A1 * | 6/2017 | Asano | G01R 33/09 |
| 2017/0199253 | A1 | 7/2017 | Okada et al. | |
| 2017/0336443 | A1 * | 11/2017 | Yokota | G01R 15/207 |

FOREIGN PATENT DOCUMENTS

| | | |
|---|---|---|
| WO | WO 92/12438 A1 | 7/1992 |
| WO | WO 2014/123142 A1 | 8/2014 |
| WO | WO 2015/190468 A1 | 12/2015 |
| WO | WO 2016/013438 A1 | 1/2016 |

OTHER PUBLICATIONS

International Search Report dated Jun. 6, 2017 in PCT/JP2017/010185 filed Mar. 14, 2017.
Japanese Office Action dated Oct. 16, 2017 in Application No. 2017-549529 (with English translation).

* cited by examiner

MAGNETIC SENSOR DEVICE

TECHNICAL FIELD

This application relates to a magnetic sensor device that detects a magnetic pattern formed on a sheet-shaped medium, such as paper money.

BACKGROUND ART

A magnetic sensor device disclosed in International Publication No. WO 2014-123142 (refer to Patent Literature 1) includes a magnet and a magnetic-resistance-effect-element mounted body. The magnet faces one surface of an object-to-be-detected having a magnetic component, has magnetic poles vertically-alternately arranged in the transport direction of the object-to-be-detected, and generates a cross magnetic field crossing the object-to-be-detected. The magnetic-resistance-effect-element mounted body is disposed between one of the magnetic poles of the magnet and the object-to-be-detected and outputs a variation in resistance value that indicates a variation in the transport direction component of the cross magnetic field caused by the magnetic component of the object-to-be-detected transported in the cross magnetic field. This magnetic-resistance-effect-element mounted body is disposed within the length of the one of the magnetic poles of the magnet in the transport direction at a position shifted in the transport direction from the center of the magnetic pole in the transport direction.

Another magnetic sensor device disclosed in Patent Literature 1 includes a magnetic circuit and a magnetic-resistance-effect-element mounted body. The magnetic circuit faces one surface of an object-to-be-detected having a magnetic component and generates a cross magnetic field crossing the object-to-be-detected at an interval between yokes, which are individually disposed at the center and the entry and exit sides spaced from the center in the transport direction of the object-to-be-detected. The magnetic-resistance-effect-element mounted body is disposed between a central yoke and the object-to-be-detected and outputs a variation in resistance value that indicates a variation in the transport direction component of the cross magnetic field caused by the magnetic component of the object-to-be-detected transported in the cross magnetic field. This magnetic-resistance-effect-element mounted body is disposed within the length of the central yoke in the transport direction at a position shifted in the transport direction from the center of the central yoke in the transport direction.

A magnetic sensor disclosed in Unexamined Japanese Utility Model Application Kokai Publication No. S62-68260 (refer to Patent Literature 2) includes a magnetic-resistance-effect-element mounted body fixed on a magnetic substrate, a permanent magnet fixed below the magnetic substrate, and a magnetic shield body disposed below the permanent magnet and having ends protruding upward.

CITATION LIST

Patent Literature

Patent Literature 1: International Publication No. WO2014-123142

Patent Literature 2: Unexamined Japanese Utility Model Application Kokai Publication No. S62-68260

SUMMARY OF INVENTION

Technical Problem

Each of the magnetic sensor devices disclosed in Patent Literature 1 has no magnetic shield, and has a problem in that the performance of the magnetic sensor device varies in response to a variation in the magnetic field outside the magnetic sensor device.

The magnetic sensor disclosed in Patent Literature 2 has a structure in which the ends of protrusions 11 protruding upward from a magnetic shield body 9 are located below the contact portion between a permanent magnet 8 and a mount substrate 6. That is, the permanent magnet 8 is not magnetically shielded from the lateral magnetic field in the direction perpendicular to the vertical direction of the magnetic sensor and thus is interfered with by this lateral magnetic field. The magnetic sensor thus has low electromagnetic immunity to a magnetic field outside the magnetic sensor. In addition, the magnetic shield body is electrically independent and thus functions as an antenna. The magnetic sensor thus readily causes electromagnetic interference and has low electromagnetic immunity.

In order to solve the above problems, an objective of the present disclosure is to provide a magnetic sensor device for which performance is less readily affected by a variation in the magnetic field outside the magnetic sensor device and which has increased magnetic immunity.

Solution to Problem

A magnetic sensor device according to an aspect of the present disclosure includes: a magnet; a magnetic-resistance-effect-element mounted substrate including a magnetic-resistance-effect-element mounted body mounted on the surface thereof opposite to a surface thereof facing the magnet, the magnetic-resistance-effect-element mounted body disposed along the longitudinal direction of the magnet; a case that accommodates or retains the magnet and the magnetic-resistance-effect-element mounted substrate; and a magnetic shield to cover the case except for the surface of the magnetic-resistance-effect-element mounted substrate on which the magnetic-resistance-effect-element mounted body is mounted. The magnetic shield includes: a bottom that faces a surface of the case, the surface being disposed so as to oppose the magnetic-resistance-effect-element mounted substrate across the magnet, and side walls standing from the bottom toward a side adjacent to the magnetic-resistance-effect-element mounted substrate, the side walls being spaced from each other in a transverse direction intersecting the longitudinal direction, the side walls extending in the longitudinal direction of the magnet. The side walls have ends on the side adjacent to the magnetic-resistance-effect-element mounted substrate, the ends being located between a position of a surface where the magnetic-resistance-effect-element mounted substrate opposes the magnet and a position of a surface where the magnetic-resistance-effect-element mounted body is mounted on the magnetic-resistance-effect-element mounted substrate.

Advantageous Effects of Invention

The disclosure can provide a magnetic sensor device that includes a magnetic shield covering a case and is thus less readily affected by a variation in the magnetic field outside the magnetic sensor device. This magnetic sensor device does not readily cause electromagnetic interference and has increased electromagnetic immunity.

DESCRIPTION OF EMBODIMENTS

Embodiment 1

Figure 1:
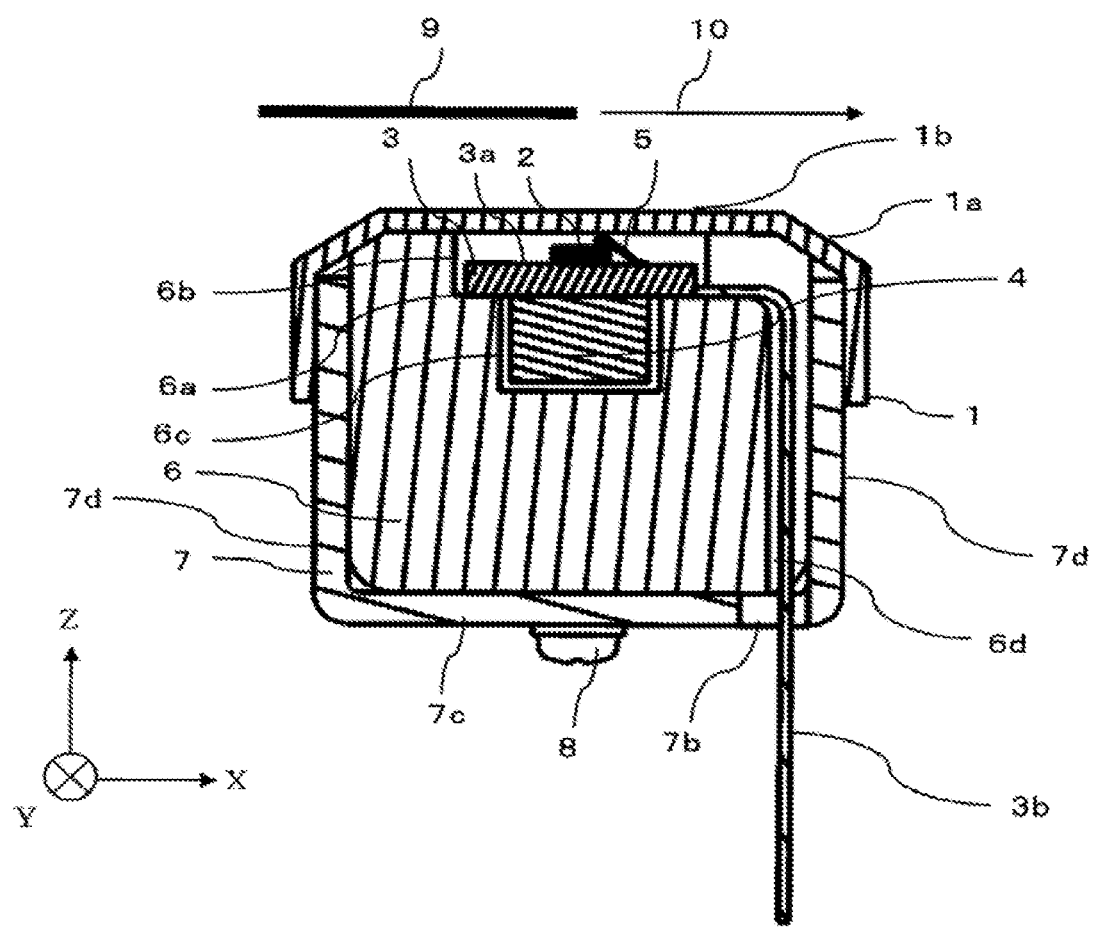
FIG. 1 is a cross-sectional view of a magnetic sensor device according to Embodiment 1 of the present disclosure taken along the XZ plane.

Embodiment 1 of the present disclosure is described with reference to the accompanying drawings. In all the drawings, identical or corresponding components are assigned the same reference characters. The drawings include three axes individually indicated by X, Y, and Z. X indicates an X axis that corresponds to a transport direction 10 in a magnetic sensor device (the transport direction 10 of transport of a detection target 9 to be transported or the transverse direction of the magnetic sensor device). Y indicates a Y axis that is perpendicular to the X axis and corresponds to a scanning transverse direction in the magnetic sensor device (the longitudinal direction of the magnetic sensor device). Z indicates a Z axis that is perpendicular to the X and Y axes and corresponds to the height direction of the magnetic sensor device. That is, the X, Y, and Z axes cross one another at an angle of 90°. The center of the magnetic sensor device in the transport direction 10 represents the origin of the X axis, the center of the magnetic sensor device in the scanning-transverse direction represents the origin of the Y axis, and transport surface of the magnetic sensor device on which the detection target 9 is transported represents the origin of the Z axis. The longitudinal and transverse directions are also referred to as "first direction" and "second direction", respectively.

In all the embodiments of the present disclosure, the expression "transport of the detection target 9" indicates not only transport of the detection target but also movement of the magnetic sensor device in the transport direction 10 (the X direction in FIG. 1) without movement of the detection target. The term "transport direction 10" indicates both of the positive X-axis direction (+X-axis direction) and the negative X-axis direction (−X-axis direction). The location through which the detection target 9 is transported in the transport direction 10 is referred to as a "transport path". The transport path corresponds to a below-described detection target transport surface 1b and a space separated by several millimeters in the +Z-axis direction from the detection target transport surface 1b.

Figure 2A:
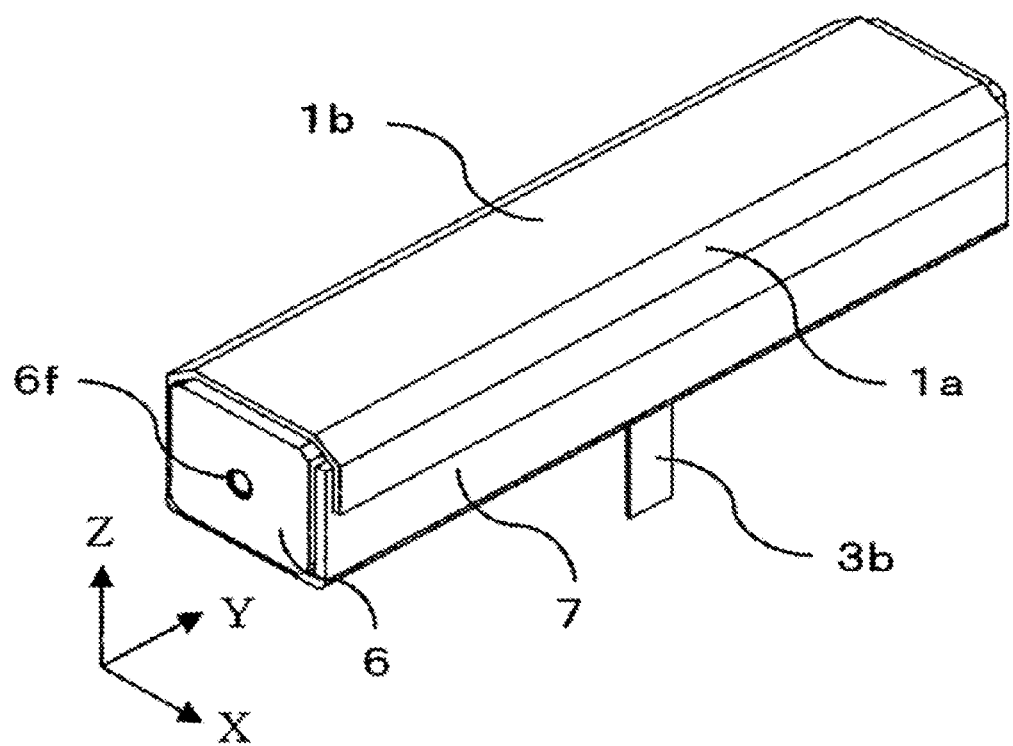
FIG. 2A is a perspective view of the magnetic sensor device according to Embodiment 1 of the present disclosure.
Figure 2B:
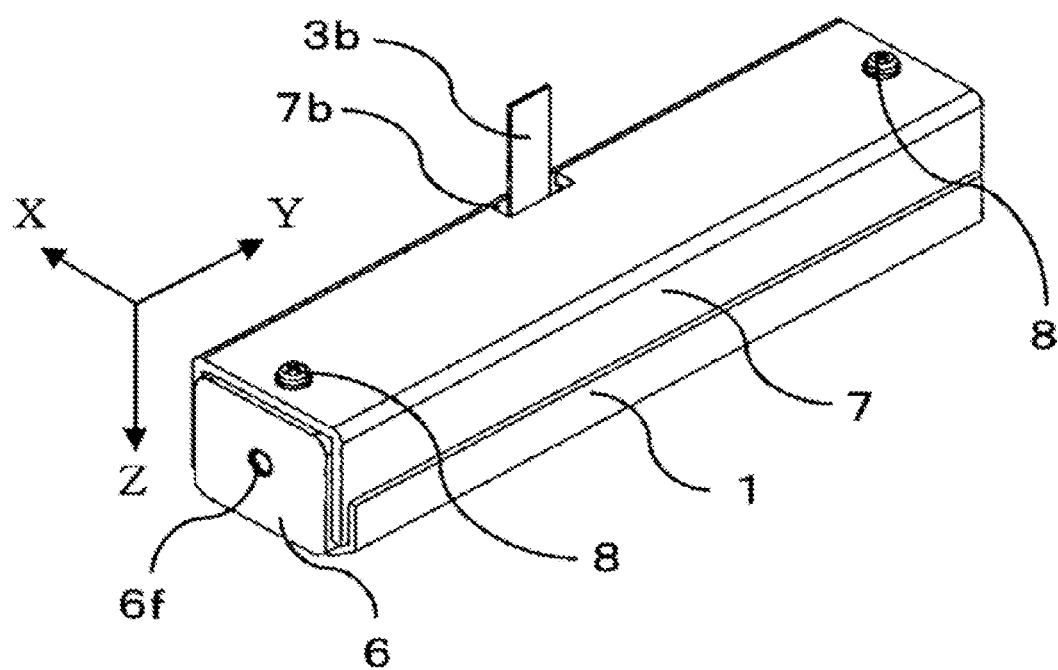
FIG. 2B is a perspective view of the magnetic sensor device according to Embodiment 1 of the present disclosure.

Configuration of the magnetic sensor device according to Embodiment 1 is described with reference to FIGS. 1 and 2. A method of fabricating the magnetic sensor device is described with reference to FIGS. 3 to 5. FIG. 1 is a cross-sectional view of the magnetic sensor device according to Embodiment 1 of the present disclosure taken along the XZ plane, as viewed in the scanning-transverse direction. FIG. 2 (FIGS. 2A and 2B) is a perspective view of the magnetic sensor device according to Embodiment 1 of the present disclosure.

Figure 3A:
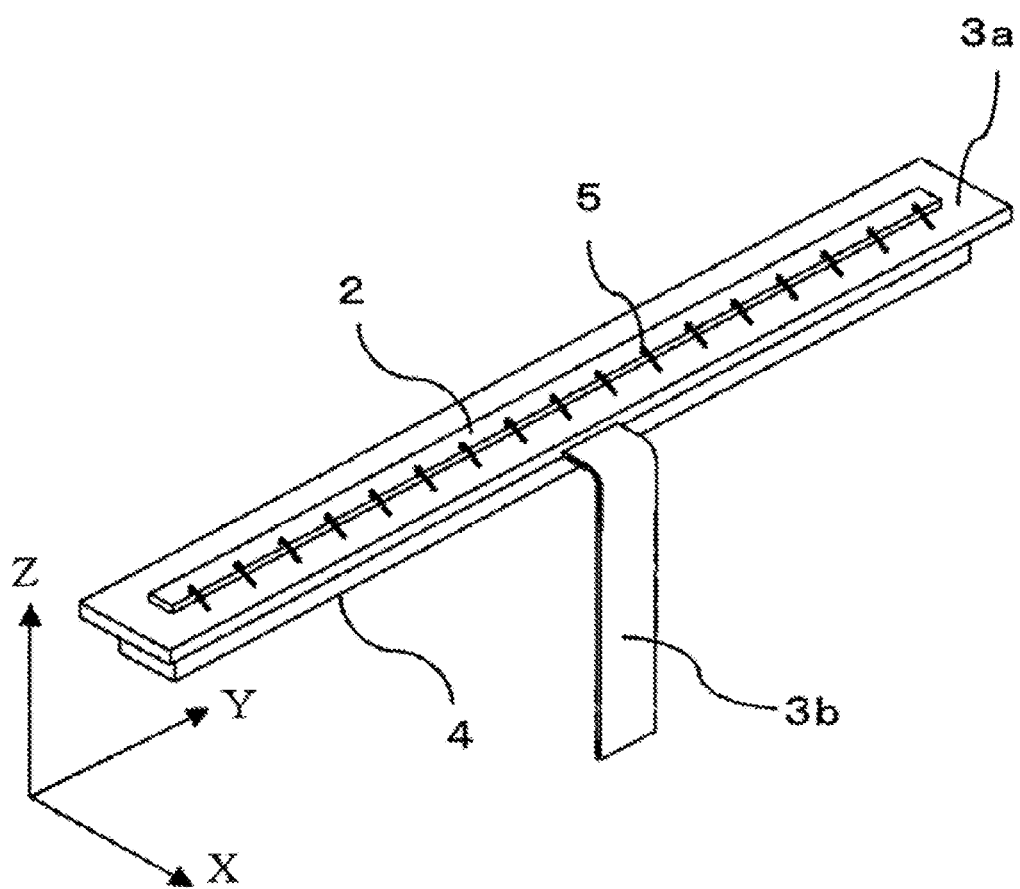
FIG. 3A is a perspective view and a cross-sectional view of an assembly of a sensor substrate, a magnetic-resistance-effect-element mounted body, and a permanent magnet in the magnetic sensor device according to Embodiment 1 of the present disclosure.
Figure 3B:
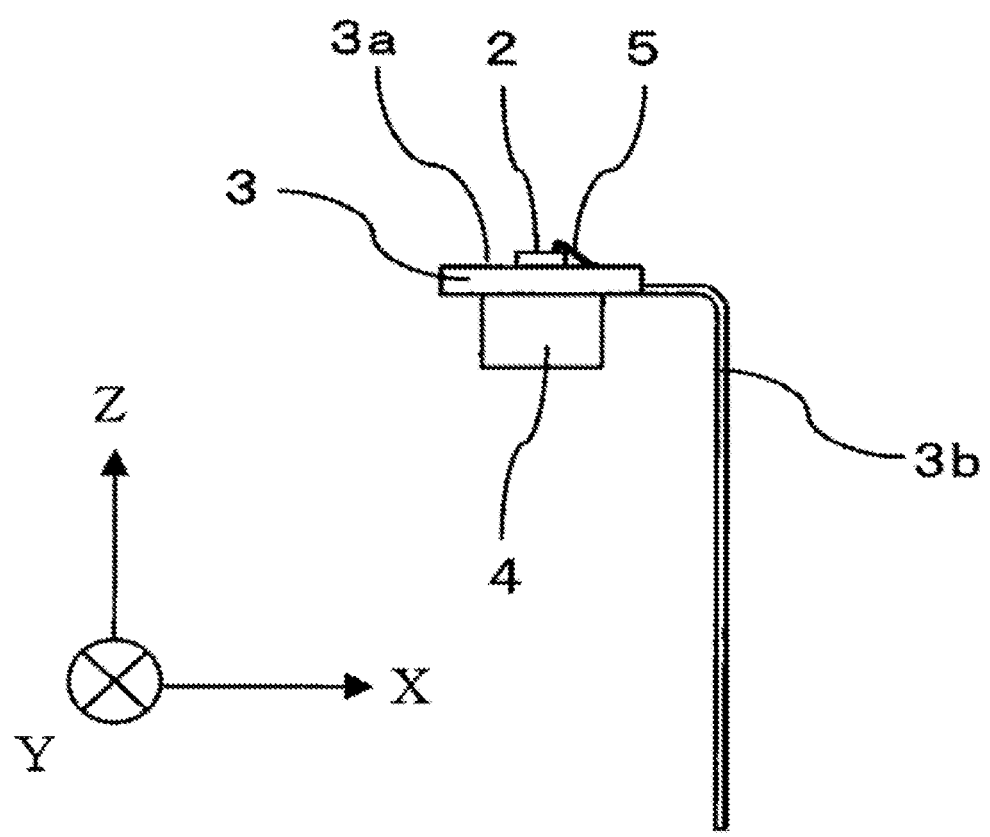
FIG. 3B is a perspective view and a cross-sectional view of the assembly of the sensor substrate, the magnetic-resistance-effect-element mounted body, and the permanent magnet in the magnetic sensor device according to Embodiment 1 of the present disclosure.
Figure 4:
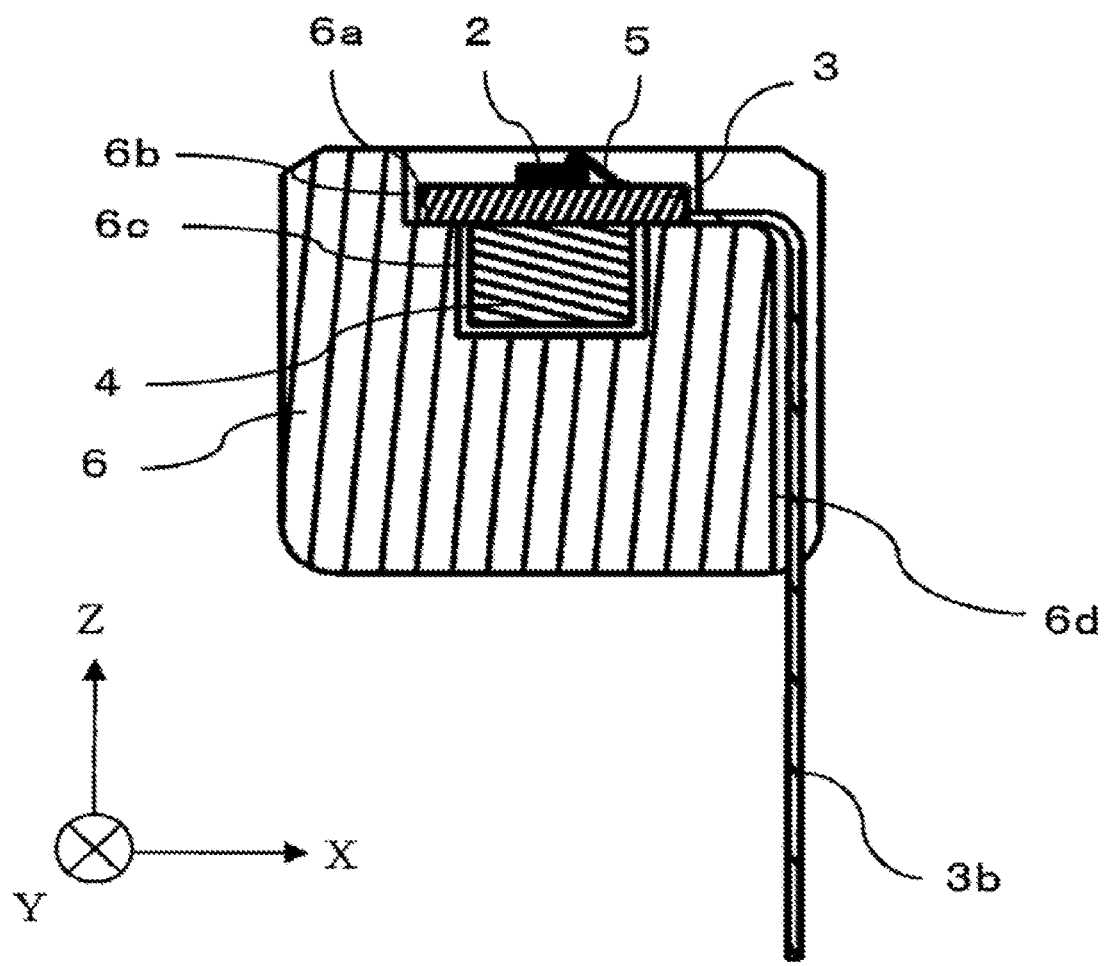
FIG. 4 is a cross-sectional view of the sensor substrate as illustrated in FIG. 3 when installed in a case in the magnetic sensor device according to Embodiment 1 of the present disclosure.
Figure 5:
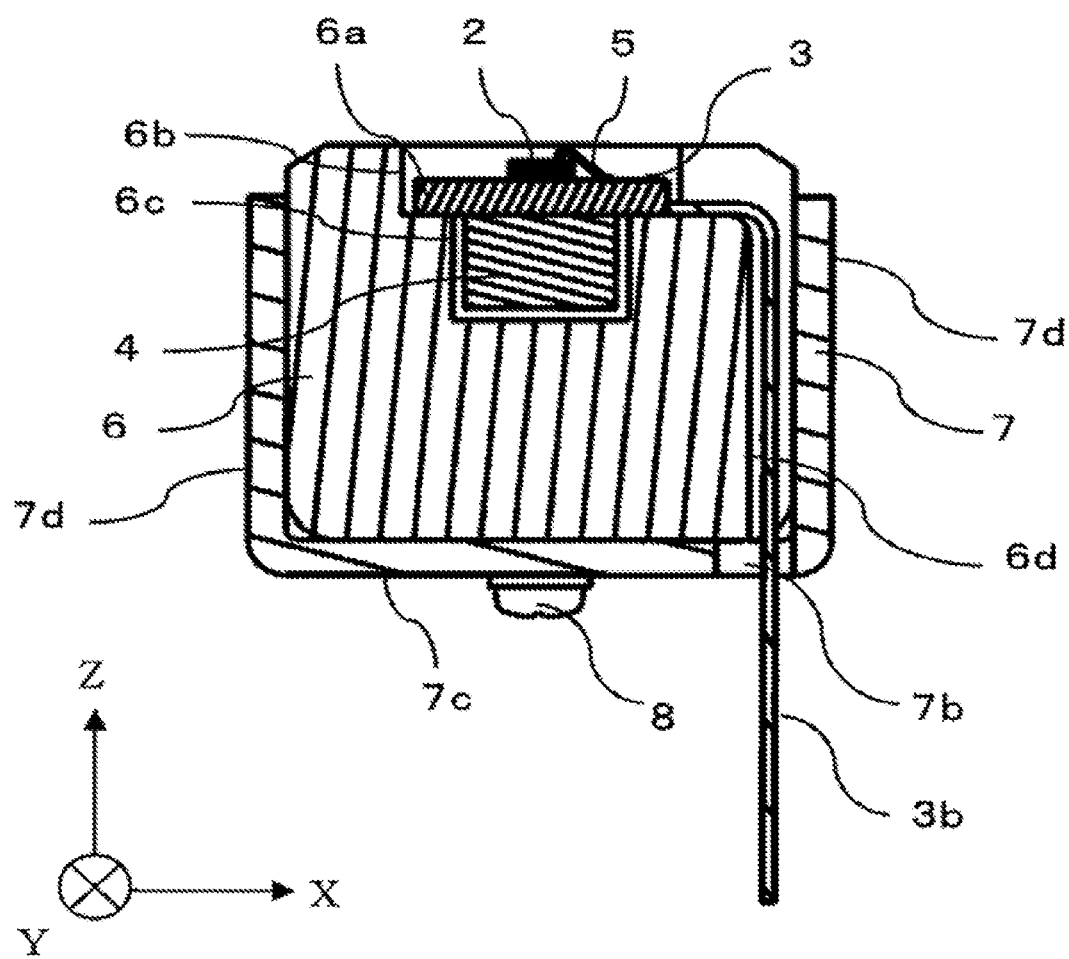
FIG. 5 is a cross-sectional view of the assembly as illustrated in FIG. 4 when provided with a magnetic shield in the magnetic sensor device according to Embodiment 1 of the present disclosure.

FIG. 3 (FIGS. 3A and 3B) is a perspective view and a cross-sectional view of an assembly of a sensor substrate, a magnetic-resistance-effect-element mounted body, and a permanent magnet in the magnetic sensor device according to Embodiment 1 of the present disclosure. FIG. 3 illustrates a first process of the method of fabricating the magnetic sensor device according to Embodiment 1. FIG. 4 is a cross-sectional view of the sensor substrate as illustrated in FIG. 3 when installed in a case in the magnetic sensor device according to Embodiment 1 of the present disclosure. FIG. 4 illustrates a second process of the method of fabricating the magnetic sensor device according to Embodiment 1. FIG. 5 is a cross-sectional view of the assembly as illustrated in FIG. 4 when provided with a magnetic shield in the magnetic sensor device according to Embodiment 1 of the present disclosure. FIG. 5 illustrates a third process of the method of fabricating the magnetic sensor device according to Embodiment 1.

Figure 6A:
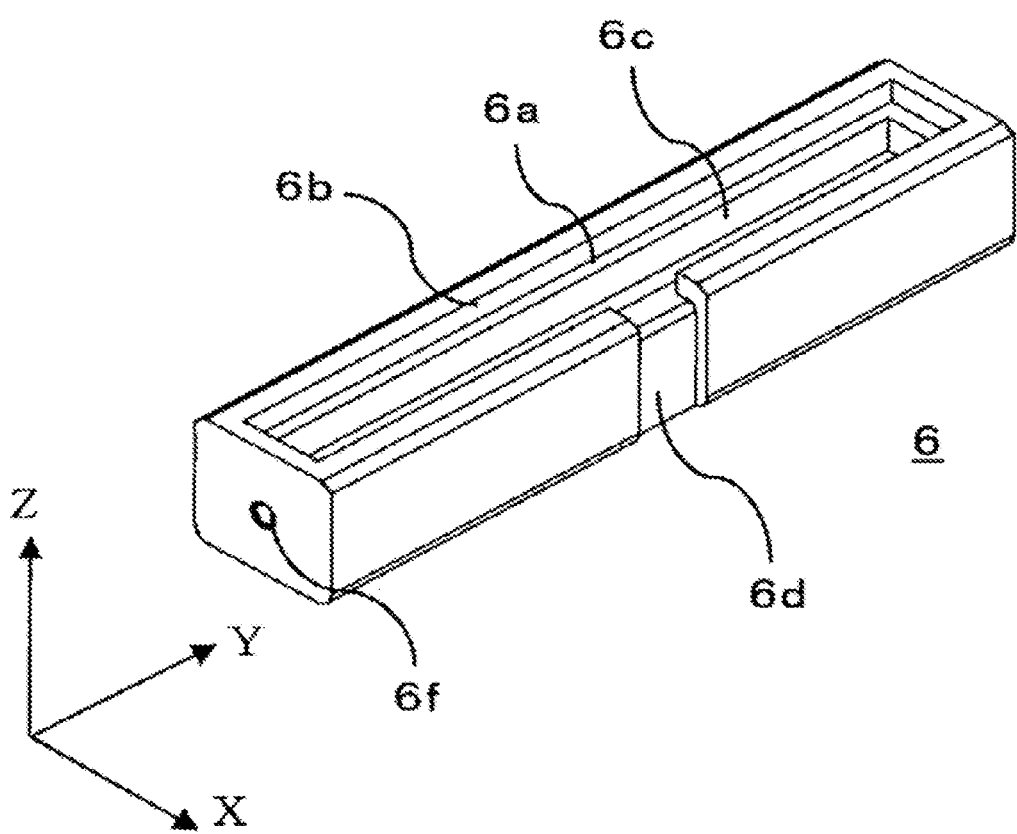
FIG. 6A is a perspective view of the case in the magnetic sensor device according to Embodiment 1 of the present disclosure.
Figure 6B:
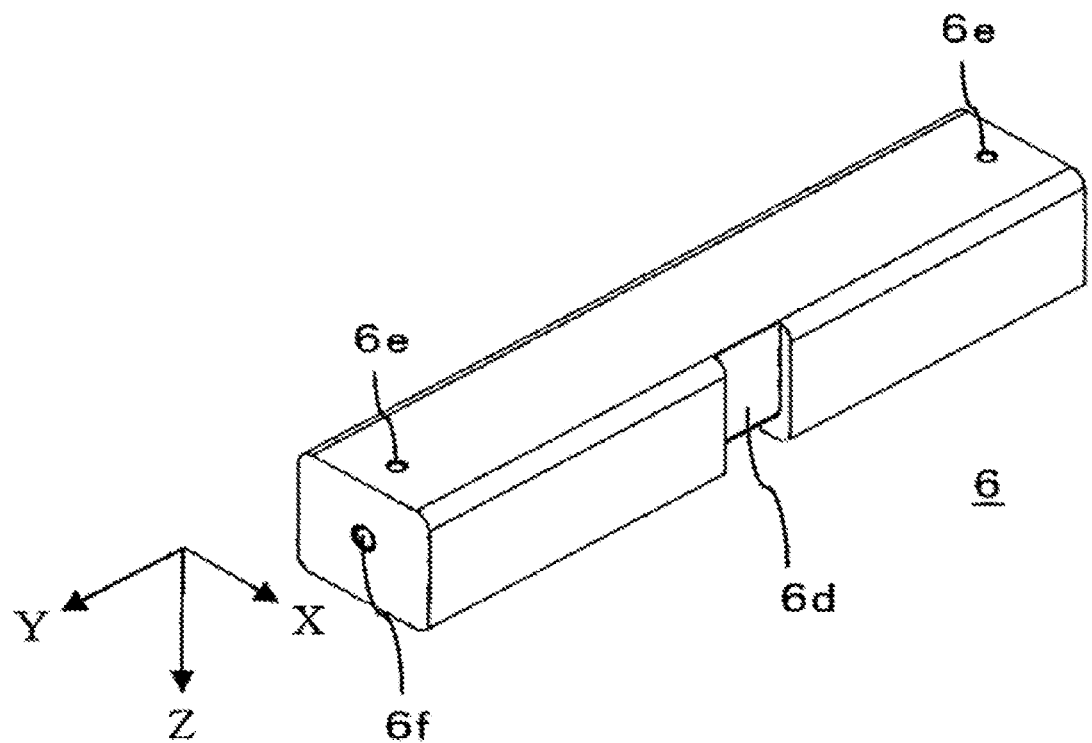
FIG. 6B is a perspective view of the case in the magnetic sensor device according to Embodiment 1 of the present disclosure.
Figure 7A:
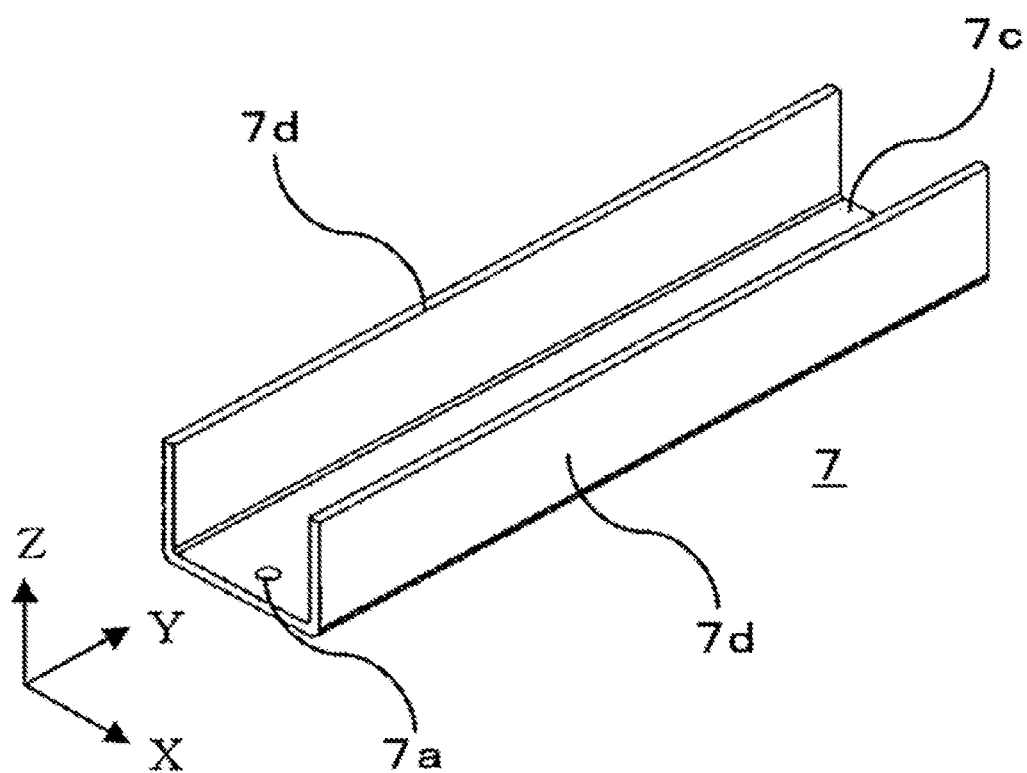
FIG. 7A is a perspective view of the magnetic shield in the magnetic sensor device according to Embodiment 1 of the present disclosure.
Figure 7B:
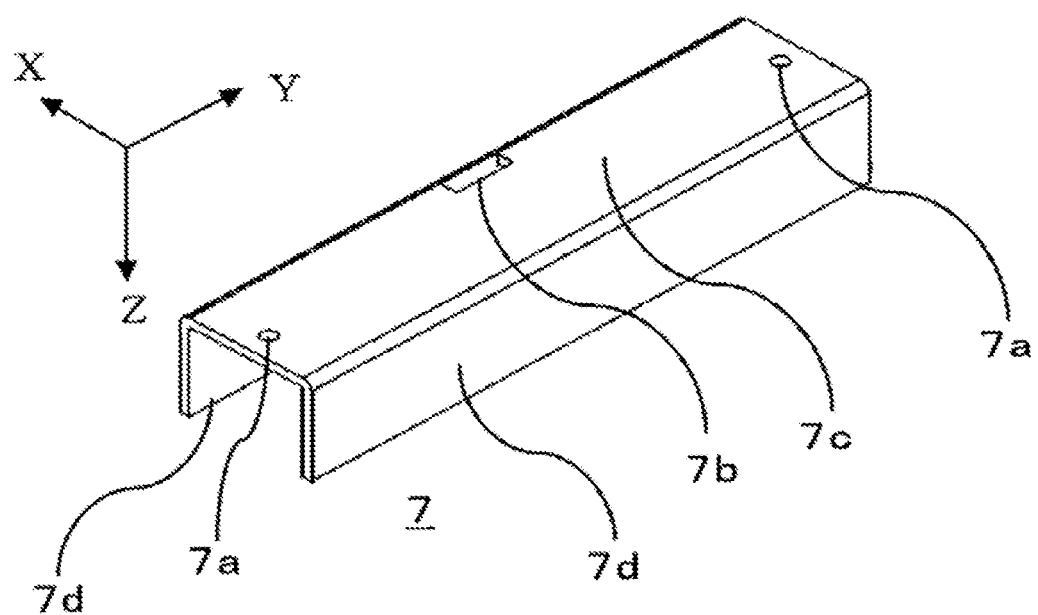
FIG. 7B is a perspective view of the magnetic shield in the magnetic sensor device according to Embodiment 1 of the present disclosure.
Figure 8A:
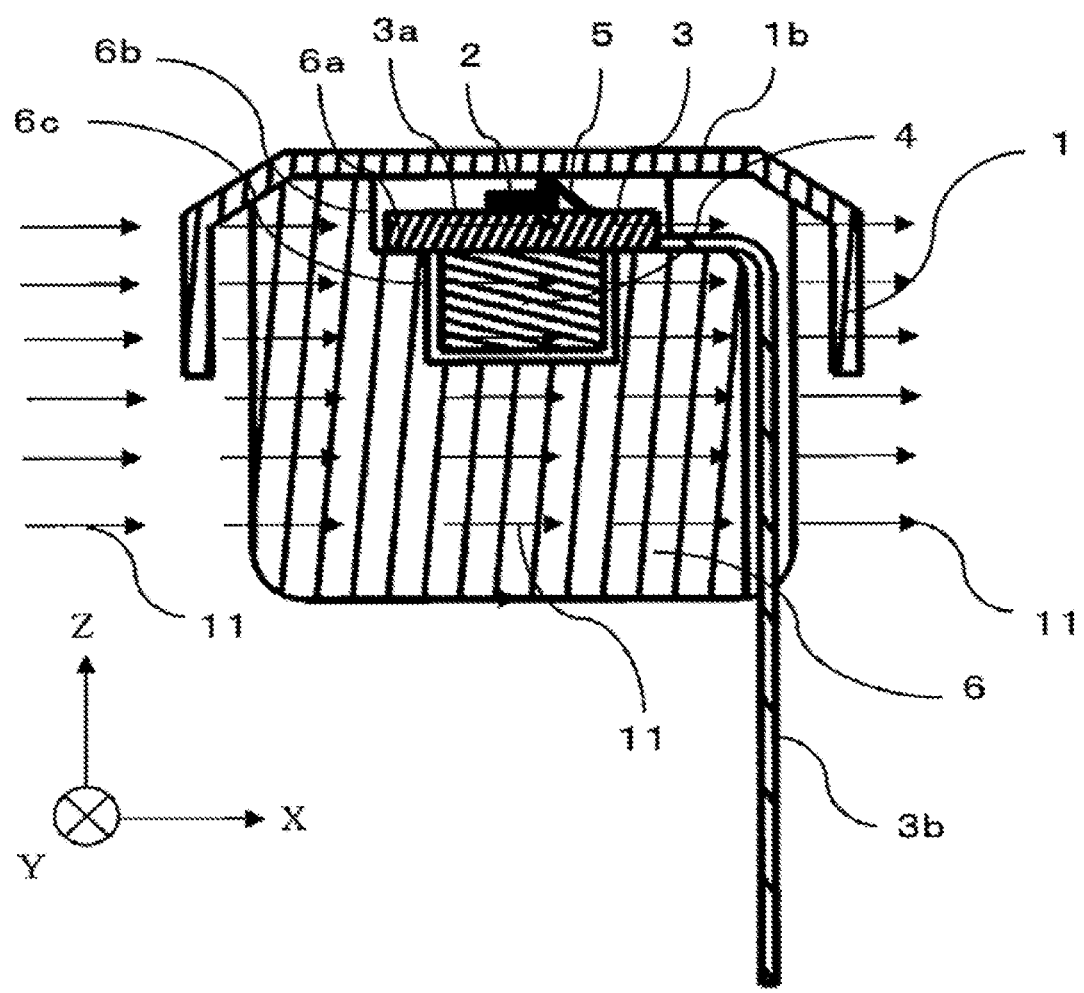
FIG. 8A is a cross-sectional view of the magnetic sensor device according to Embodiment 1 of the present disclosure taken along the XZ plane for illustrating the behavior of magnetic flux in response to a magnetic field generated outside the magnetic sensor device.
Figure 8B:
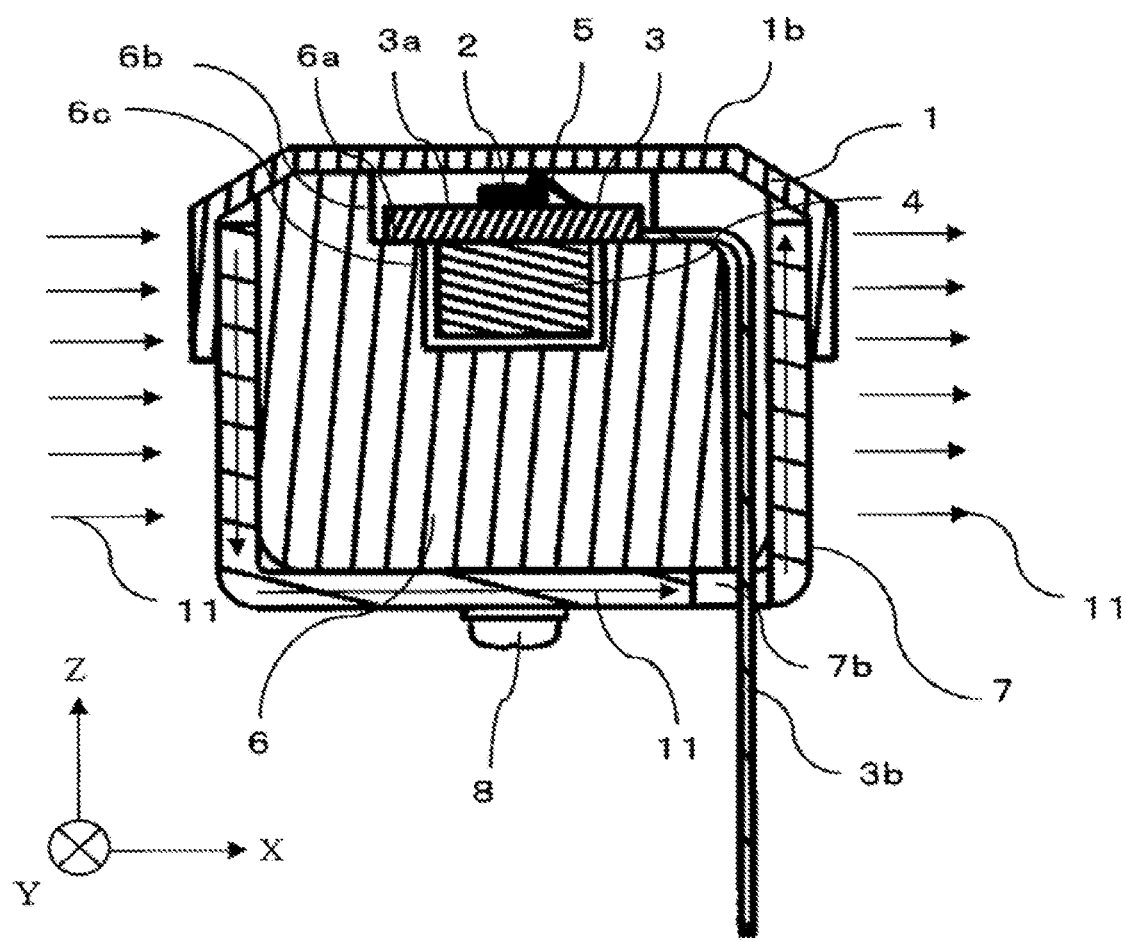
FIG. 8B is a cross-sectional view of the magnetic sensor device according to Embodiment 1 of the present disclosure taken along the XZ plane for illustrating the behavior of magnetic flux in response to a magnetic field generated outside the magnetic sensor device.

FIG. 6 (FIGS. 6A and 6B) is a perspective view of the case in the magnetic sensor device according to Embodiment 1 of the present disclosure. FIG. 7 (FIGS. 7A and 7B) is a perspective view of the magnetic shield in the magnetic sensor device according to Embodiment 1 of the present disclosure. FIG. 8 (FIGS. 8A and 8B) is a cross-sectional view of the magnetic sensor device according to Embodiment 1 of the present disclosure taken along the XZ plane for illustrating the behavior of magnetic flux in response to a magnetic field generated outside the magnetic sensor device.

The components of the magnetic sensor device according to Embodiment 1 is described in detail with reference to FIGS. 1 to 8. A cover 1 forms a detection target transport surface in the magnetic sensor device. The cover 1 extends along the transport surface in the magnetic sensor device in the Y-axis direction (the scanning-transverse direction or longitudinal direction). The cover 1 has a shape that covers, among surfaces facing the Z-axis direction of the case 6 (the height direction), a surface on which a magnetic-resistance-effect-element mounted body 2 is disposed. The case 6 has an open box shape open to the side adjacent to the detection target transport surface in the Z-axis direction (the height direction). The case 6 includes an opening for accommodating and retaining some components of the magnetic sensor device according to Embodiment 1 and holes and attachment surfaces for position alignment.

A sensor substrate 3 is disposed between the cover 1 and a permanent magnet 4 in the Z-axis direction (the height direction) and extends in the Y-axis direction (the scanning-transverse direction or longitudinal direction). The sensor substrate 3 may be a single substrate extending in the Y-axis direction (the scanning-transverse direction or longitudinal direction), or may be divided into two or more segments extending in the Y-axis direction (the scanning-transverse direction or longitudinal direction). The sensor substrate 3 includes the magnetic-resistance-effect-element mounted body 2 on the surface on the positive side in the Z-axis direction (the side adjacent to the transport path), which is opposite to the surface facing the permanent magnet 4.

As illustrated in FIGS. 1 and 3, the sensor substrate 3 includes a mounted portion 3a on which the magnetic-resistance-effect-element mounted body 2 is mounted and an external connector 3b for transmitting electrical signals from the magnetic-resistance-effect-element mounted body 2 to the outside. The mounted portion 3a is formed on the surface of the sensor substrate 3 on the positive side in the Z-axis direction (the side adjacent to the transport path).

As illustrated in FIGS. 1 and 3, the magnetic-resistance-effect-element mounted body 2 is fixed on the mounted portion 3a of the sensor substrate 3 with, for example, an adhesive. The position of the magnetic-resistance-effect-element mounted body 2 on the mounted portion 3a of the sensor substrate 3 in the XY-axial directions may vary as required for positioning of the detecting portion of the magnetic sensor device.

The magnetic-resistance-effect-element mounted body 2 detects a variation in the transport direction component of the magnetic field (that is, a variation in the bias magnetic field) caused by transport of the detection target 9, such as paper money, having a magnetic component in the transport direction 10, resulting in a variation in the resistance value of the magnetic-resistance-effect-element mounted body 2. This variation in the resistance value changes the signal to be output from the magnetic-resistance-effect-element mounted body 2. The magnetic-resistance-effect-element mounted body 2 detects the component of the magnetic field emitted from the permanent magnet 4 in the transport direction 10 (the X-axis direction or transverse direction) as a bias magnetic field.

The sensor substrate 3 is electrically connected to the magnetic-resistance-effect-element mounted body 2 via wires 5. The sensor substrate 3 includes the external connector 3b for transmitting electrical signals from the magnetic-resistance-effect-element mounted body 2 to the outside. The sensor substrate 3 on which the magnetic-resistance-effect-element mounted body 2 is mounted is also referred to as "magnetic-resistance-effect-element mounted substrate 3".

The surface of the sensor substrate 3 on the negative side in the Z-axis direction (the side distant from the transport path), that is, the surface of the sensor substrate 3 facing the permanent magnet 4, is partially in contact with the case 6. This surface in contact with the case 6 is fixed to the case 6 with, for example, an adhesive.

The position of the sensor substrate 3 in the XY-axial directions is determined by fitting the sensor substrate 3 in an opening 6b of the case 6. The position of the sensor substrate 3 in the Z-axis direction (the height direction) is determined by attachment of the surface of the sensor substrate 3 opposite to the surface including the magnetic-resistance-effect-element mounted body 2 to a step 6a.

The permanent magnet 4 has a rod shape extending in the Y-axis direction (the scanning-transverse direction or longitudinal direction).

The permanent magnet 4 is fixed on the surface of the sensor substrate 3 opposite to the surface including the magnetic-resistance-effect-element mounted body 2 with, for example, an adhesive. That is, the permanent magnet 4 is fixed on the surface of the sensor substrate 3 on the negative side in the Z-axis direction (the side distant from the transport path) with, for example, an adhesive.

The position of the permanent magnet 4 in the Z-axis direction (the height direction) is determined by disposing the permanent magnet 4 in parallel with the magnetic-resistance-effect-element mounted body 2 and bringing the permanent magnet 4 into contact with the surface of the sensor substrate 3 opposite to the surface including the magnetic-resistance-effect-element mounted body 2. The position of the permanent magnet 4 in the X-axis direction (the transport direction 10 or transverse direction) is determined by aligning the center of the permanent magnet 4 in the X-axis direction and the center of the magnetic-resistance-effect-element mounted body 2 in the X-axis direction to substantially the same position.

The permanent magnet 4 may be a single magnet extending in the Y-axis direction (the scanning-transverse direction or longitudinal direction) or may be formed from two or more segments extending in the Y-axis direction (the scanning-transverse direction or longitudinal direction).

The permanent magnet 4 generates a magnetic field and applies a bias magnetic field to the magnetic-resistance-effect-element mounted body 2. The magnitude of the bias magnetic field is varied by the transport of the detection target 9 through the transport path across the magnetic field emitted from the permanent magnet 4. This variation in the bias magnetic field varies the resistance value of the magnetic-resistance-effect-element mounted body 2, and the magnetic-resistance-effect-element mounted body 2 then outputs a detection signal.

A displacement of the permanent magnet 4 in the X-axis direction (the transport direction 10 or transverse direction) varies the magnetic force of the magnetic field that is emitted from the permanent magnet 4 and applied to the magnetic-resistance-effect-element mounted body 2 and the detection target 9. The position of the permanent magnet 4 in the X-axis direction (the transport direction 10 or transverse direction) may thus be finely adjusted while observing the performance of the magnetic sensor device.

As illustrated in FIG. 1, the cover 1 has a shape that covers, among surfaces facing the Z-axis direction of the case 6 (the height direction), a surface on which the magnetic-resistance-effect-element mounted body 2 is disposed. That is, the cover 1 covers the surface of the sensor substrate 3 on which the magnetic-resistance-effect-element mounted body 2 is mounted.

As illustrated in FIGS. 1 and 2, the cover 1 has: the detection target transport surface 1b, which is a flat surface formed along the X-axis direction (the transport direction 10 or transverse direction) when the magnetic sensor device is viewed in the Y-axis direction (the scanning-transverse direction or longitudinal direction); and a pair of slant surfaces 1a inclined from the respective ends of the detection target transport surface 1b in the X-axis direction (the transport direction 10 or transverse direction) toward the negative height direction (−Z-axis direction), that is, toward the side distant from the transport path. The pair of slant surfaces 1a and the detection target transport surface 1b extend in the Y-axis direction (the scanning-transverse direction or longitudinal direction).

The pair of slant surfaces 1a and the detection target transport surface 1b of the cover 1 are integrally formed by bending a thin metal plate. The cover 1 is attached to the surface of the case 6 that is adjacent to the transport path. The cover 1 has the slant surfaces 1a functioning as transport guides. This cover 1 can enable the detection target 9 to be transported along the slant surfaces 1a and suppress and prevent movement of the detection target 9 in a direction other than the X-axis direction (the transport direction 10 or transverse direction).

The cover 1 can protect the magnetic sensor device, in particular, the magnetic-resistance-effect-element mounted body 2 from shocks and abrasion due to hitting and rubbing by the detection target 9 during the transport on the magnetic sensor device. The cover 1 is disposed between the detection target 9 and the magnetic-resistance-effect-element mounted body 2 and is thus preferably formed of a non-magnetic material so as not to affect the magnetic sensitivity of the magnetic sensor device. Examples of the non-magnetic material include non-magnetic metals, such as aluminum, ceramics, and resins.

Although the cover 1 is fabricated by bending a thin metal plate (for example, an aluminum plate) in Embodiment 1, the cover 1 may be made of any material by any procedure as long as the cover 1 can perform the above-described functions.

As illustrated in FIGS. 1, 2, and 6, the case 6 accommodates and retains therein the components (members or parts), such as the sensor substrate 3 and the permanent magnet 4, other than the cover 1 and a magnetic shield 7. The case 6 is formed of an electrically conductive material, such as a metal (for example, aluminum) or an electrically conductive resin. The case 6 has the opening 6b for position alignment of the sensor substrate 3 in the X and Y directions. The opening 6b is recessed downward from the surface of the case 6 attached to the cover 1 toward the negative side in the Z-axis direction (the side distant from the transport path). The bottom of the opening 6b on the negative side in the Z-axis direction (the side distant from the transport path) includes the step 6a that supports the sensor substrate 3 mounted thereon in the height direction (Z-axis direction).

The case 6 further has an opening 6c recessed downward from the step 6a toward the negative side in the Z-axis direction (the side distant from the transport path). The length of the lower opening 6c in the X-axis direction (the transport direction 10 or transverse direction) is shorter than the length of the upper opening 6b in the X-axis direction (the transport direction or transverse direction). The lower opening 6c accommodates the permanent magnet 4 and thus determines the position of the permanent magnet 4 in the X and Y directions. The case 6 further includes a groove 6d on a part of a side surface of the case 6 extending in the Y-axis direction (the scanning transverse direction or longitudinal direction). The groove 6d extends from the step 6a to the surface of the case 6 on the negative side in the Z-axis direction (the side distant from the transport path). The groove 6d is a pathway that accommodates the external connector 3b that outputs a signal detected in the magnetic sensor device from the sensor substrate 3 mounted on the step 6a to the outside.

In addition, the case 6 has magnetic-shield attachment holes 6e into which screws 8, functioning as fasteners for fixing the magnetic shield 7 to the case 6, are threaded. The magnetic-shield attachment holes 6e are disposed on the surface of the case 6 on the negative side in the Z-axis direction (the side distant from the transport path) at two positions spaced from each other in the Y-axis direction (the scanning-transverse direction or longitudinal direction). The magnetic shield 7 has a hole 7b at the position corresponding to the position of the groove 6d of the case 6 on the surface on the negative side in the Z-axis direction (the side distant from the transport path). The hole 7b exposes the external connector 3b to the outside of the magnetic sensor device.

As illustrated in FIG. 1, the upper opening 6b of the case 6 provides a space for preventing the cover 1 from coming into contact with the magnetic-resistance-effect-element mounted body 2 or the wires 5.

The case 6 can also allow heat emitted from the magnetic-resistance-effect-element mounted body 2 to escape to the outside of the magnetic sensor device.

The case 6 is preferably formed of a non-magnetic material, such as aluminum, so as not to affect the magnetic field.

Although the case 6 is fabricated by cutting an aluminum block in Embodiment 1, the case 6 may be made of any material by any procedure as long as the case 6 can perform the above-described functions.

As illustrated in FIGS. 1 and 3, the wires 5 electrically connect the magnetic-resistance-effect-element mounted body 2 to the sensor substrate 3.

As illustrated in FIGS. 1, 5, and 7, the magnetic shield 7 has a bottom 7c formed extending in the X-axis direction (the transport direction 10 or transverse direction) when the magnetic sensor device is viewed in the Y-axis direction (the scanning-transverse direction or longitudinal direction). The bottom 7c faces the bottom of the case 6 disposed so at to oppose the sensor substrate 3 across the permanent magnet 4. The magnetic shield 7 further has a pair of side walls 7d spaced from each other in the X-axis direction (the transport direction 10 or transverse direction). The side walls 7d are vertically arranged at the respective ends of the bottom 7c in the X-axis direction (the transport direction 10 or transverse direction) in the positive height direction (the positive Z-axis direction), that is, standing toward the side adjacent to the sensor substrate 3, when the magnetic sensor device is viewed in the Y-axis direction (the scanning-transverse direction or longitudinal direction). The pair of side walls 7d and the bottom 7c extend in the Y-axis direction (the scanning-transverse direction or longitudinal direction). As illustrated in FIGS. 1, 5, and 7, the bottom 7c has a planar shape. Each of the side walls 7d also has a planar shape. That is, the magnetic shield 7 is open toward the side opposite to the bottom 7c in the Z-axis direction. The length of the magnetic shield 7 in the Y-axis direction (the scanning-transverse direction or longitudinal direction) is preferably at least equal to or greater than the lengths of the permanent magnet 4 and the sensor substrate 3 in the Y-axis direction (the scanning-transverse direction or longitudinal direction).

The case 6 is disposed in the space (inside the magnetic shield 7) surrounded by the bottom 7c and the pair of side walls 7d of the magnetic shield 7. The magnetic shield 7 is fixed to the case 6 with the fasteners or an adhesive, for example. That is, the case 6 is covered with the magnetic shield 7 except for the surface to which the sensor substrate 3 is fixed. As illustrated in FIG. 1, the bottom 7c of the magnetic shield 7 is fastened to the surface of the case 6 on the negative side in the Z-axis direction (the side distant from the transport path) with the screws 8 as fasteners. The bottom 7c and the pair of side walls 7d of the magnetic shield 7 may be separately fabricated and then coupled to each other with an adhesive, for example, or may be integrally formed by bending a thin metal plate or extruding a block of material.

As illustrated in FIGS. 1, 5, and 7, the position of the magnetic shield 7 in the Z-axis direction is determined by fixing the magnetic shield 7 on the surface of the case 6 opposite to the upper opening 6b with the fasteners 8, such as screws. The position of the magnetic shield 7 in the XY-axial directions is determined by aligning two attachment holes 7a of the magnetic shield 7 to the two magnetic-shield attachment holes 6e of the case 6. The fasteners 8, such as screws, pass through attachment holes 7a and fasten to the magnetic-shield attachment holes 6e.

The ends of the pair of side walls 7d of the magnetic shield 7 in the Z-axis direction are located at substantially the same position in the Z-axis direction as the surface of the sensor substrate 3 including the mounted portion 3a, that is, as the surface of the sensor substrate 3 on the positive side in the Z-axis direction (the side adjacent to the transport path). The ends of the pair of side walls 7d of the magnetic shield 7 in the Z-axis direction (the height direction) are located at a position at least equal to the position of the surface of the sensor substrate 3 opposite to the surface including the mounted portion 3a, that is, the surface of the sensor substrate 3 on the negative side in the Z-axis direction (the side distant from the transport path), that is, the surface of the sensor substrate 3 facing the permanent magnet 4. The ends of the side walls 7d are preferably located more adjacent to the positive side in the Z-axis direction (the side adjacent to the transport path) than the surface of the sensor substrate 3 opposite to the surface including the mounted portion 3a, that is, the surface of the sensor substrate 3 on the negative side in the Z-axis direction (the side distant from the transport path), that is, the surface of the sensor substrate 3 facing the permanent magnet 4. Accordingly, the magnetic shield 7 covers the case 6 at least from the position corresponding to the surface of the sensor substrate 3 facing the permanent magnet 4 across the portion of the case 6 on the side opposite to the surface of the permanent magnet 4 facing the sensor substrate 3 (negative Z-axis direction or side distant from the transport path).

In other words, the ends of the pair of side walls 7d of the magnetic shield 7 in the Z-axis direction (the height direction) are preferably located at the same position as the surface of the permanent magnet 4 on the positive side in the Z-axis direction (the side adjacent to the transport path), that is, the surface of the permanent magnet 4 facing the sensor substrate 3, or be located more adjacent to the positive side in the Z-axis direction (the side adjacent to the transport path) (that is, more distant from the surface of the sensor substrate 3 facing the permanent magnet 4) than the surface of the permanent magnet 4 on the positive side in the Z-axis direction (the side adjacent to the transport path), that is, the surface of the permanent magnet 4 facing the sensor substrate 3. Accordingly, the magnetic shield 7 covers the case 6 at least from the position corresponding to the surface of the permanent magnet 4 facing the sensor substrate 3 across the portion of the case 6 on the side opposite to the surface of the permanent magnet 4 facing the sensor substrate 3 (the negative Z-axis direction or side distant from the transport path).

As illustrated in FIG. 8, if a magnetic field is generated outside the magnetic sensor device mainly in a direction other than the direction from the detection target transport surface 1b, the magnetic shield 7 can suppress or prevent a magnetic variation from occurring inside the magnetic sensor device due to the magnetic flux of the magnetic field passing through the inside of the magnetic shield 7. The magnetic shield 7 is therefore formed from a magnetic material.

The magnetic shield 7 can also receive heat emitted from the magnetic-resistance-effect-element mounted body 2 via the case 6 and transfer the heat to the outside of the magnetic sensor device.

Thus the magnetic shield 7 is preferably formed of a material, such as iron or silicon steel, having high magnetic permeability and high thermal conductivity.

Although the magnetic shield 7 is fabricated by bending a thin metal plate in Embodiment 1 of the present disclosure, the magnetic shield 7 may be made of any material by any procedure as long as the magnetic shield 7 can perform the above-described functions.

The fasteners 8 function by fixing the magnetic shield 7 to the case 6 and by electrically connecting the case 6 to the magnetic shield 7. The fasteners 8 are screws that have electrical conductivity.

Although the fasteners 8 are described as screws in Embodiment 1, the fasteners 8 may be any means or may be formed from any material as long as the fasteners 8 can perform the above-described functions.

A method of fabricating the magnetic sensor device according to Embodiment 1 of the present disclosure is described with reference to FIGS. 1 and 3 to 5. This fabricating method includes two basic processes: a sensor substrate assembly process and a case fitting process, as explained below. The sensor substrate assembly process is to be executed prior to the case fitting process.

The sensor substrate assembly process is described with reference to FIG. 3. The sensor substrate assembly process that includes mounting the magnetic-resistance-effect-element mounted body 2 on the mounted portion 3a of the sensor substrate 3, electrically connecting the magnetic-resistance-effect-element mounted body 2 to the sensor substrate 3 with the wires 5, and fixing the permanent magnet 4 onto the surface of the sensor substrate 3 opposite to the mounted portion 3a.

The magnetic-resistance-effect-element mounted body 2 is fixed onto the mounted portion 3a of the sensor substrate 3 with, for example, an adhesive. The magnetic-resistance-effect-element mounted body 2 is then electrically connected to the sensor substrate 3 with the wires 5.

The permanent magnet 4 is fixed onto the surface of the sensor substrate 3 opposite to the mounted portion 3a, with, for example, an adhesive. The center of the permanent magnet 4 in the Y-axis direction and the center of the magnetic-resistance-effect-element mounted body 2 in the Y-axis direction are disposed at the same position in the Y-axis direction, while the center of the permanent magnet 4 in the X-axis direction and the center of the magnetic-resistance-effect-element mounted body 2 in the X-axis direction are disposed at the same position in the X-axis direction. The permanent magnet 4 is not necessarily a single magnet and may be formed by two or more permanent magnets 4 integrated in the Y-axis direction (the scanning-transverse direction or longitudinal direction).

Although the centers of the permanent magnet 4 and the magnetic-resistance-effect-element mounted body 2 in the XY-axial directions are positioned together in Embodiment 1, the relative positions of the permanent magnet 4 and the magnetic-resistance-effect-element mounted body 2 may vary as required for positioning of the detecting portion of the magnetic sensor device.

The case fitting process is described with reference to FIGS. 1, 4, and 5. The case fitting process is a process of fixing the sensor substrate 3 (after the sensor substrate assembly process), the cover 1, and the magnetic shield 7 onto the case 6.

As illustrated in FIG. 4, the positions of the sensor substrate 3 and the permanent magnet 4 in the Z-axis direction (the height direction) are determined by bringing the surface of the sensor substrate 3 to which the permanent magnet 4 is fixed, that is, the surface of the sensor substrate 3 on the negative side in the Z-axis direction (the side distant from the transport path), into contact with the step 6a of the case 6, and fixing the surface to the step 6a with, for example, an adhesive. The sensor substrate 3 fits in the upper opening 6b of the case 6 and the permanent magnet 4 fits in the lower opening 6c, so as to determine the positions of the sensor substrate 3 and the permanent magnet 4 in the XY-axial directions.

As illustrated in FIG. 5, the magnetic shield 7 is fixed with the fasteners 8 to the case 6 of the magnetic sensor device during assembly in a state as illustrated in FIG. 4. In this configuration, the two magnetic-shield attachment holes 6e of the case 6 illustrated in FIG. 6 and the two attachment holes 7a of the magnetic shield 7 illustrated in FIG. 7 are positioned together.

The external connector 3b of the sensor substrate 3 fits in the groove 6d of the case 6 so as not to interfere with the magnetic shield 7. The external connector 3b of the sensor substrate 3 extends through the hole 7b of the magnetic shield 7 and is thus exposed to the outside of the magnetic sensor device.

As illustrated in FIG. 1, the cover 1 is fixed with, for example, an adhesive onto the magnetic sensor device during assembly as illustrated in FIG. 5. The cover 1 is disposed so as to cover the upper opening 6b of the case 6 and the ends of the pair of side walls 7d of the magnetic shield 7 in the Z-axis direction (the height direction). In this configuration, the upper opening 6b of the case 6 functions as a spacer and can thus prevent the cover 1 from coming into contact with the sensor substrate 3, the magnetic-resistance-effect-element mounted body 2, and the wires 5.

Although the above description of Embodiment 1 described the position alignment of the individual components, as long as the magnetic shield 7 performs the functions described in Embodiment 1, the other components may have any shape, may be fixed at any position, and may be made of any material by any procedure. For example, the magnetic-resistance-effect-element mounted substrate 3 in Embodiment 1 is described as using the sensor substrate 3 formed of a resin substrate. Alternatively, the magnetic-resistance-effect-element mounted substrate 3 may be a metal carrier to improve heat emission from the magnetic-resistance-effect-element mounted body 2. In this case, the magnetic-resistance-effect-element mounted body 2 is fixed on the surface of the metal carrier with, for example, an adhesive, and a resin substrate is formed on the surface of the metal carrier so as to surround the magnetic-resistance-effect-element mounted body 2. The magnetic-resistance-effect-element mounted body 2 is connected to this resin substrate with the wires 5, thereby outputting a signal from the magnetic-resistance-effect-element mounted body 2 to the outside of the magnetic sensor device.

The behavior inside the magnetic sensor device according to Embodiment 1 in response to a magnetic field generated outside the magnetic sensor device is described below.

FIG. 8 is a cross-sectional view of the magnetic sensor device according to Embodiment 1 of the present disclosure taken along the XZ plane for illustrating the behavior of magnetic flux 11 in the X-axis direction (the transport direction 10 or transverse direction) when a magnetic field occurs outside the magnetic sensor device. As illustrated in FIG. 8A, in the magnetic sensor device without the magnetic shield 7, the magnetic flux 11 in the X-axis direction (the transport direction 10 or transverse direction) generated by the magnetic field outside the magnetic sensor device passes through the case 6 and arrives at the permanent magnet 4. Specifically, if the side adjacent to the magnetic-resistance-effect-element mounted body 2 in FIG. 8A is defined as the upper side, the magnetic flux 11 is applied from the left to the right in the X-axis direction. Since the cover 1 is formed of a non-magnetic material, such as aluminum, the magnetic flux 11 keeps advancing in the X-axis direction, passes through the cover 1, and then arrives at the case 6. Since the case 6 is formed of a non-magnetic material, such as aluminum, the magnetic flux 11 keeps advancing in the X-axis direction and arrives at the permanent magnet 4. The magnetic field emitted from the permanent magnet 4 is affected by the magnetic flux 11 of the magnetic field outside the magnetic sensor device, and the magnitude and direction of the magnetic field emitted from the permanent magnet 4 vary. This variation varies the bias magnetic field at the magnetic-resistance-effect-element mounted body 2 and causes a malfunction when a signal is output from the magnetic-resistance-effect-element mounted body 2 even though there is no conveyance of the detection target 9. Furthermore, the variation in the bias magnetic field may inhibit the magnetic-resistance-effect-element mounted body 2 from outputting a signal in response to conveyance of the detection target 9, leading to a failure to detect the detection target 9. The variation in the bias magnetic field may also cause the signal output from the magnetic-resistance-effect-element mounted body 2 to become smaller or larger, preventing accurate detection of the detection target 9.

The magnetic sensor device detects magnetism based on the electrical signal output from the magnetic-resistance-effect-element mounted body 2, and thus a variation in the performance of the magnetic-resistance-effect-element mounted body 2 due to a variation in the bias magnetic field directly results in a variation in the performance of the magnetic sensor device. In the magnetic sensor device without the magnetic shield 7, a variation in the magnetic field outside the magnetic sensor device varies the performance of the magnetic sensor device, and thus this magnetic sensor device provides unstable performance in the environment in which an unstable magnetic field exists outside the magnetic sensor device.

As illustrated in FIG. 8B, in the magnetic sensor device with a structure that includes the magnetic shield 7, the magnetic flux 11 in the X-axis direction (the transport direction 10 or transverse direction) generated by the magnetic field outside the magnetic sensor device passes through the magnetic shield 7 along the magnetic shield 7. Specifically, if the side adjacent to the magnetic-resistance-effect-element mounted body 2 in FIG. 8B is defined as the upper side, the magnetic flux 11 is applied from the left to the right in the X-axis direction. Since the cover 1 is formed of a non-magnetic material, such as aluminum, the magnetic flux 11 keeps advancing in the X-axis direction, passes through the cover 1, and then arrives at the left side wall 7d of the magnetic shield 7. Since the magnetic shield 7 is formed from a magnetic material, the magnetic flux 11 passes through the left side wall 7d of the magnetic shield 7, through the bottom 7c of the magnetic shield 7, through the right side wall 7d of the magnetic shield 7, and is then is emitted to the outside from the right side wall 7d of the magnetic shield 7. The magnetic flux 11 thus does not pass through the permanent magnet 4. This configuration can reduce the magnetic effects of the magnetic field outside the magnetic sensor device on the components of the magnetic sensor device inside the magnetic shield 7. The magnetic flux 11 outside the magnetic sensor device thus does not reach the permanent magnet 4, and thus the permanent magnet 4 emits a stable magnetic field. The configuration can therefore stabilize the bias magnetic field at the magnetic-resistance-effect-element mounted body 2, thereby suppressing malfunctioning of the magnetic sensor device and improving the uncertainty of detection signals. By this means, a magnetic sensor device is achieved that has good and stable performance independent of the magnetic field outside the magnetic sensor device.

The magnetic shield 7 covers the case 6 at least from the position corresponding to the surface of the permanent magnet 4 facing the sensor substrate 3 across the portion of the case 6 on the side opposite to the surface of the permanent magnet 4 facing the sensor substrate 3 (the negative Z-axis direction or side distant from the transport path). As viewed through the YZ plane in the X-axis direction in FIG. 8B, the permanent magnet 4 is thus hidden behind the side wall 7d of the magnetic shield 7. Accordingly, the magnetic flux 11 in the X-axis direction (the transport direction 10 or transverse direction) never arrives at the permanent magnet 4, as illustrated in FIG. 8B. The magnetic flux 11 thus does not affect the bias magnetic field emitted from the permanent magnet 4, and a magnetic sensor device is obtained that has good and stable performance independent of the magnetic field outside the magnetic sensor device.

In addition, the ends of the pair of side walls 7d of the magnetic shield 7 in the Z-axis direction (the height direction) are more adjacent to the detection target transport surface 1b than the mounted portion 3a of the sensor substrate 3, thereby enabling magnetic shielding of the magnetic sensor device from variations in the magnetic field outside the magnetic sensor device other than a variation in the magnetic field applied from the side of the detection target transport surface 1b.

The magnetic shield 7 and a magnetic circuit according to Embodiment 1 are described below.

The magnetic shield 7 and the components forming the magnetic circuit of the magnetic sensor device (for example, the permanent magnet 4) sandwich the case 6 therebetween and are thus fixed and spaced from each other by at least a certain distance, thus the magnetic shield 7 is independent from the magnetic circuit of the magnetic sensor device.

Since the magnetic shield 7 is independent from the magnetic circuit, modification of the shape of the magnetic shield 7 or detachment of the magnetic shield 7 does not greatly affect the performance of the magnetic sensor device. That is, the magnetic sensor device can provide constant performance regardless of modification or detachment of the magnetic shield 7, depending on the state of the magnetic field outside the magnetic sensor device.

The electromagnetic compatibility in Embodiment 1 of the present disclosure is described below. In FIGS. 2 and 6, external connection parts 6f are ground terminals for connecting the magnetic sensor device to an external ground. The case 6 and the magnetic shield 7 are each formed of an electrically conductive material, such as a metal. Each of the external connection parts 6f is connected by a fastener, such as a screw, to a metal wire or metal plate disposed on an external ground, although these components are not illustrated.

In general, when electrically independent from the external ground, the magnetic shield 7 can possibly function as an antenna. Thus the magnetic shield 7 then emits or receives electromagnetic interference waves. The emission of electromagnetic interference waves may affect peripheral devices around the magnetic sensor device, and the reception of electromagnetic interference waves may cause noise in the electrical signal output from the magnetic sensor device, thereby impairing the performance of the magnetic sensor device.

In Embodiment 1, the case 6 is formed of an electrically conductive material and is electrically connected to the magnetic shield 7 via the fasteners 8. Since the case 6 is electrically connected to the external ground via the external connection parts 6f, the magnetic shield 7 can also be electrically connected to the external ground. The magnetic shield 7 is thus grounded, and the magnetic shield 7 is prevented from functioning as an antenna. Due to electrical stability of the magnetic shield 7, a magnetic sensor device is obtained that has good performance.

For the cover 1 formed from a non-magnetic metal, such as aluminum, when the ends of the pair of side walls 7d of the magnetic shield 7 on the positive side in the Z-axis direction (the side adjacent to the transport path), that is, the sensor substrate 3-side ends contact the cover 1, the electrical stability of the magnetic shield 7 further improves.

As described above, Embodiment 1 can provide the magnetic sensor device having high magnetic and electrical stability and reliable electromagnetic compatibility.

Embodiment 2

Figure 9A:
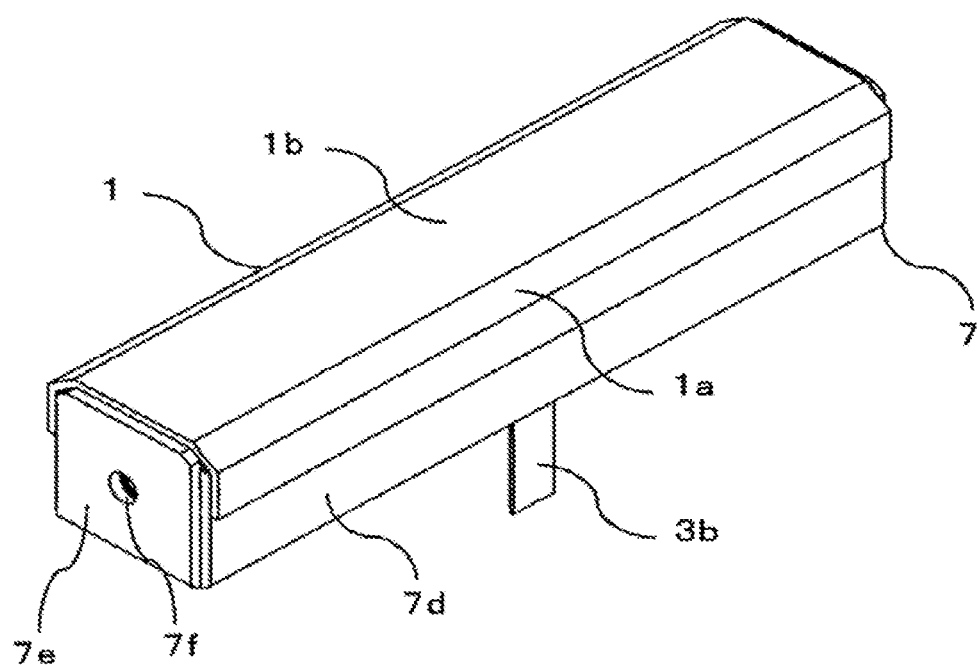
FIG. 9A is a perspective view of a magnetic sensor device according to Embodiment 2 of the present disclosure.
Figure 9A:
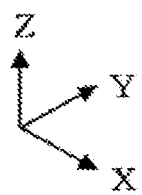
Figure 9B:
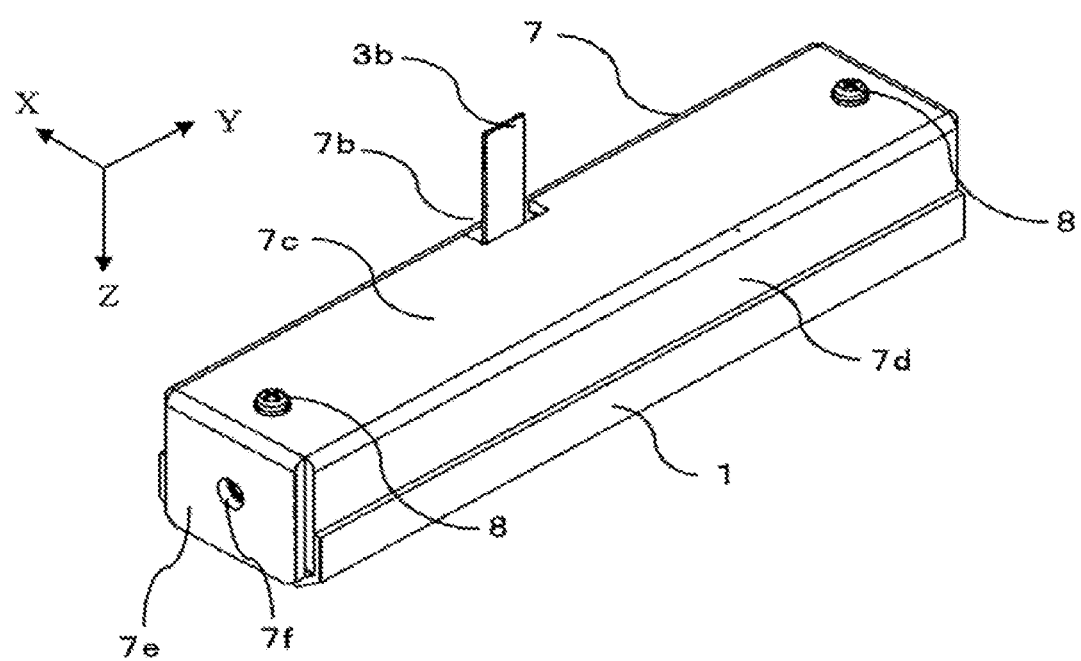
FIG. 9B is a perspective view of the magnetic sensor device according to Embodiment 2 of the present disclosure.
Figure 10:
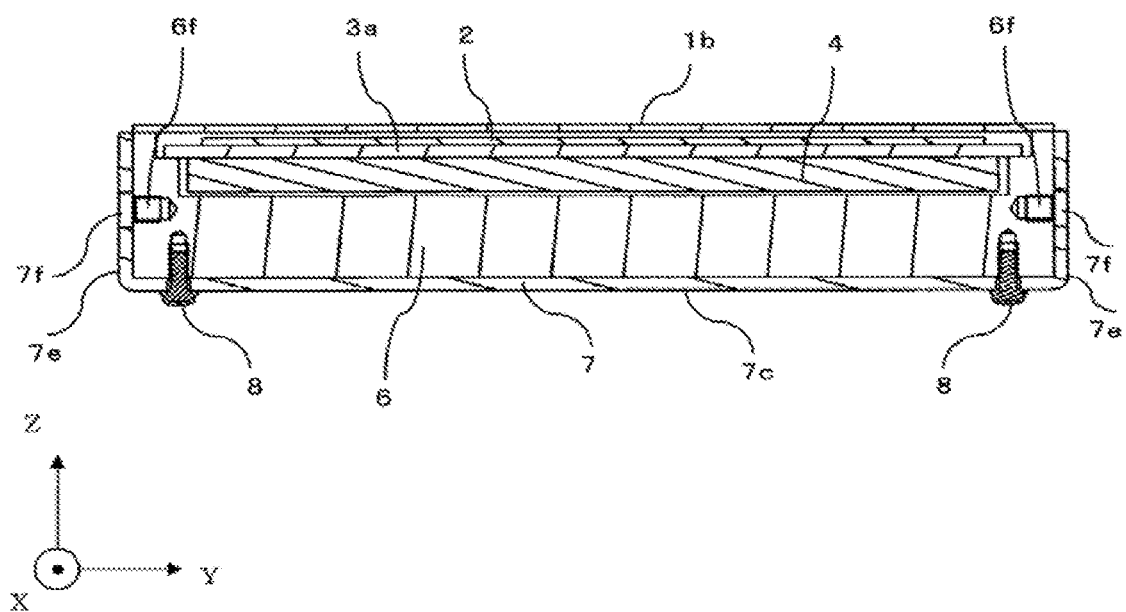
FIG. 10 is a cross-sectional view of the magnetic sensor device according to Embodiment 2 of the present disclosure taken along the YZ plane.
Figure 11A:
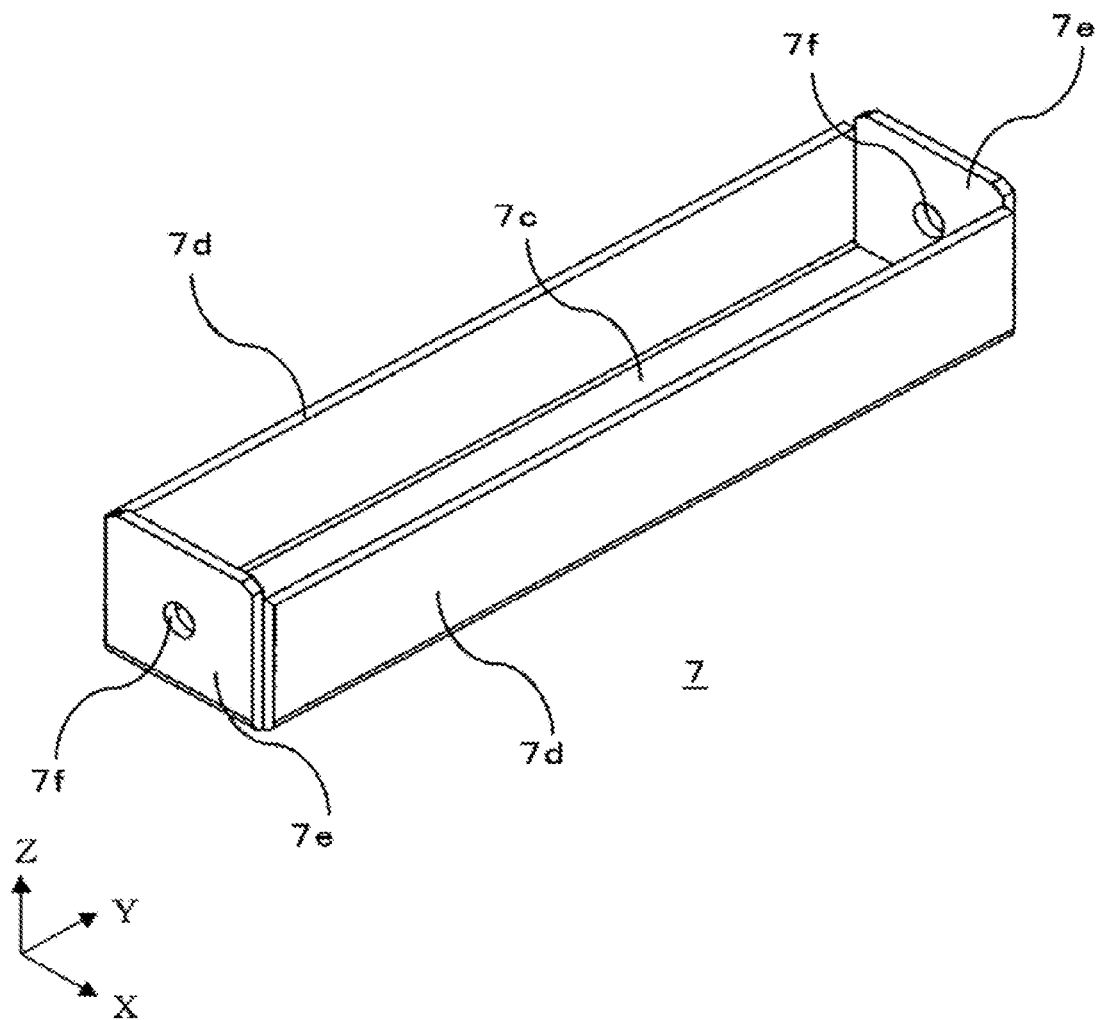
FIG. 11A is a perspective view of a magnetic shield in the magnetic sensor device according to Embodiment 2 of the present disclosure.
Figure 11B:
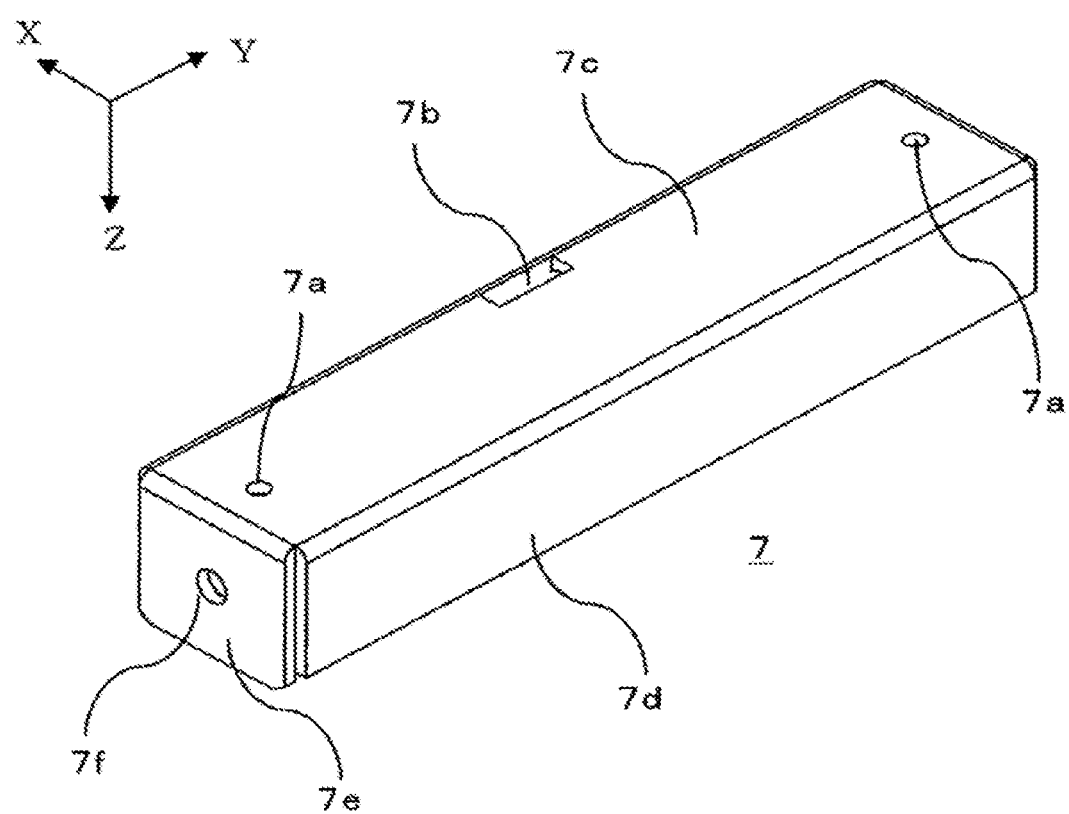
FIG. 11B is a perspective view of the magnetic shield in the magnetic sensor device according to Embodiment 2 of the present disclosure.

A magnetic sensor device according to Embodiment 2 of the present disclosure is described below with reference to the accompanying drawings. FIG. 9 (FIGS. 9A and 9B) is a perspective view of the magnetic sensor device according to Embodiment 2 of the present disclosure. FIG. 10 is a cross-sectional view of the magnetic sensor device according to Embodiment 2 of the present disclosure taken along the YZ plane. FIG. 11 (FIGS. 11A and 11B) is a perspective view of the magnetic shield in the magnetic sensor device according to Embodiment 2 of the present disclosure. In FIGS. 9 to 11, the components identical or corresponding to those in FIGS. 1 to 8 are assigned the same reference characters, and description of such components is omitted.

As illustrated in FIGS. 9 to 11, the magnetic shield 7 has the bottom 7c extending in the X-axis direction (the transport direction 10 or transverse direction) when the magnetic sensor device is viewed in the Y-axis direction (the scanning-transverse direction or longitudinal direction). The bottom 7c faces the bottom of the case 6 disposed so at to oppose the sensor substrate 3 across the permanent magnet 4. The magnetic shield 7 further has the pair of side walls 7d spaced from each other in the X-axis direction (the transport direction 10 or transverse direction). The side walls 7d are arranged at the respective ends of the bottom 7c in the X-axis direction (the transport direction 10 or transverse direction) and stand upward in the positive height direction (the positive Z-axis direction), that is, stand toward the side adjacent to the sensor substrate 3, when the magnetic sensor device is viewed in the Y-axis direction (the scanning-transverse direction or longitudinal direction). The pair of side walls 7d and the bottom 7c extend in the Y-axis direction (the scanning-transverse direction or longitudinal direction). As illustrated in FIGS. 9 to 11, the bottom 7c has a planar shape. Each of the pair of side walls 7d also has a planar shape.

The magnetic shield 7 further has the bottom 7c formed along the Y-axis direction (the scanning-transverse direction or longitudinal direction) and a pair of second side walls 7e spaced from each other in the Y-axis direction (the scanning-transverse direction or longitudinal direction). The pair of second side walls 7e are arranged at the respective ends of the bottom 7c in the Y-axis direction (the scanning-transverse direction or longitudinal direction) and stand upward in the positive height direction (the positive Z-axis direction), that is, stand toward the side adjacent to the sensor substrate 3, when the magnetic sensor device is viewed in the X-axis direction (the transport direction 10 or transverse direction). The pair of second side walls 7e and the bottom 7c extend in the X-axis direction (the transport direction or transverse direction). As illustrated in FIGS. 9 to 11, each of the second side walls 7e has a planar shape. That is, the magnetic shield 7 has the rectangular bottom 7c, the pair of side walls 7d standing from the long sides of the bottom 7c, and the pair of second side walls 7e standing from the short sides of the bottom 7c, and the magnetic shield 7 thus has an open box shape open to the side opposite to the bottom 7c in the Z-axis direction.

The length of the magnetic shield 7 in the Y-axis direction (the scanning-transverse direction or longitudinal direction) is preferably at least equal to or longer than the lengths of the permanent magnet 4 and the sensor substrate 3 in the Y-axis direction (the scanning-transverse direction or longitudinal direction). In the magnetic shield 7 illustrated in FIGS. 9 to 11, the length of the side walls 7d in the Y-axis direction (the scanning-transverse direction or longitudinal direction) is equal to the length of the case 6 in the Y-axis direction (the scanning-transverse direction or longitudinal direction), while the length of second side walls 7e in the X-axis direction (the transport direction or transverse direction) is equal to the length of the case 6 in the X-axis direction (the transport direction or transverse direction).

The case 6 is disposed in the space (inside the magnetic shield 7) surrounded by the bottom 7c, the pair of side walls 7d, and the pair of second side walls 7e of the magnetic shield 7, and the magnetic shield 7 is fixed to the case 6 with the fasteners or an adhesive, for example. That is, the case 6 is covered with the magnetic shield 7 except for the surface on which is fixed the sensor substrate 3. As illustrated in FIG. 1, the bottom 7c of the magnetic shield 7 is fastened to the surface of the case 6 on the negative side in the Z-axis direction (the side distant from the transport path) with the screws 8 as fasteners, and is fixed thereby. The bottom 7c, the pair of side walls 7d, and the pair of second side walls 7e of the magnetic shield 7 may be separately fabricated and then coupled to one another with an adhesive, for example, or may be integrally formed by bending a thin metal plate or extruding a block of material.

As illustrated in FIGS. 9 to 11, the position of the magnetic shield 7 in the Z-axis direction is determined by fixing the magnetic shield 7 on the surface of the case 6 opposite to the upper opening 6b via the fasteners 8, such as screws. The position of the magnetic shield 7 in the XY-axial directions is determined by aligning the two attachment holes 7a of the magnetic shield 7 to the two magnetic-shield attachment holes 6e of the case 6. The fasteners 8, such as screws, pass through the attachment holes 7a and are fastened into the magnetic-shield attachment holes 6e.

The ends of the pair of side walls 7d and the pair of second side walls 7e of the magnetic shield 7 in the Z-axis direction are located at substantially the same position in the Z-axis direction as the surface of the sensor substrate 3 including the mounted portion 3a, that is, as the surface of the sensor substrate 3 on the positive side in the Z-axis direction (the side adjacent to the transport path). The ends of the pair of side walls 7d and the pair of second side walls 7e of the magnetic shield 7 in the Z-axis direction (the height direction) are located at a position at least equal to the position of the surface of the sensor substrate 3 opposite to the surface including the mounted portion 3a, that is, the surface of the sensor substrate 3 on the negative side in the Z-axis direction (the side distant from the transport path), that is, the surface of the sensor substrate 3 facing the permanent magnet 4. The ends are preferably located more adjacent to the positive side in the Z-axis direction (the side adjacent to the transport path) than the surface of the sensor substrate 3 opposite to the surface including the mounted portion 3a, that is, the surface of the sensor substrate 3 on the negative side in the Z-axis direction (the side distant from the transport path), that is, the surface of the sensor substrate 3 facing the permanent magnet 4. Accordingly, the magnetic shield 7 covers the case 6 at least from the position corresponding to the surface of the sensor substrate 3 facing the permanent magnet 4 across the portion of the case 6 on the side opposite to the surface of the permanent magnet 4 facing the sensor substrate 3 (the negative Z-axis direction or side distant from the transport path).

In other words, the ends of the pair of side walls 7d and the pair of second side walls 7e of the magnetic shield 7 in the Z-axis direction (the height direction) are located at the same position as the surface of the permanent magnet 4 on the positive side in the Z-axis direction (the side adjacent to the transport path), that is, the surface of the permanent magnet 4 facing the sensor substrate 3. The ends are preferably located more adjacent to the positive side in the Z-axis direction (the side adjacent to the transport path) (that is, more distant from the surface of the sensor substrate 3 facing the permanent magnet 4) than the surface of the permanent magnet 4 on the positive side in the Z-axis direction (the side adjacent to the transport path), that is, the surface of the permanent magnet 4 facing the sensor substrate 3. Accordingly, the magnetic shield 7 covers the case 6 at least from the position corresponding to the surface of the permanent magnet 4 facing the sensor substrate 3 across the portion of the case 6 on the side opposite to the surface of the permanent magnet 4 facing the sensor substrate 3 (the negative Z-axis direction or side distant from the transport path).

Each of the pair of second side walls 7e of the magnetic shield 7 is provided with a through hole 7f for an external joint member to reach the corresponding external connection part 6f of the case 6. The through holes 7f are disposed at the positions corresponding to the respective external connection parts 6f of the case 6 when the magnetic shield 7 is fixed to the case 6.

The ends of the pair of second side walls 7e of the magnetic shield 7 in the Z-axis direction may further extend in the Z-axis direction from the position of the surface of the sensor substrate 3 including the mounted portion 3a, that is, the surface of the sensor substrate 3 on the positive side in the Z-axis direction (the side adjacent to the transport path), or may be in contact with the cover 1. Alternatively, the pair of second side walls 7e of the magnetic shield 7 may have configure that covers the entire side surfaces of the case 6 that face the Y-axis direction (the scanning-transverse direction or longitudinal direction).

The behavior inside the magnetic sensor device caused by the pair of second side walls 7e in response to a magnetic field generated outside the magnetic sensor device is the same as the behavior caused by the pair of side walls 7d according to Embodiment 1.

The magnetic shield 7 according to Embodiment 2 includes not only the side walls 7d extending in the Y-axis direction (the scanning-transverse direction or longitudinal direction) but also the second side walls 7e extending in the X-axis direction (the transport direction or transverse direction). The magnetic sensor device can therefore less readily cause electromagnetic interference in response to not only a variation in the magnetic field in the X-axis direction (the transport direction or transverse direction) but also a variation in the magnetic field in the Y-axis direction (the scanning-transverse direction or longitudinal direction).

Embodiment 3

Figure 12A:
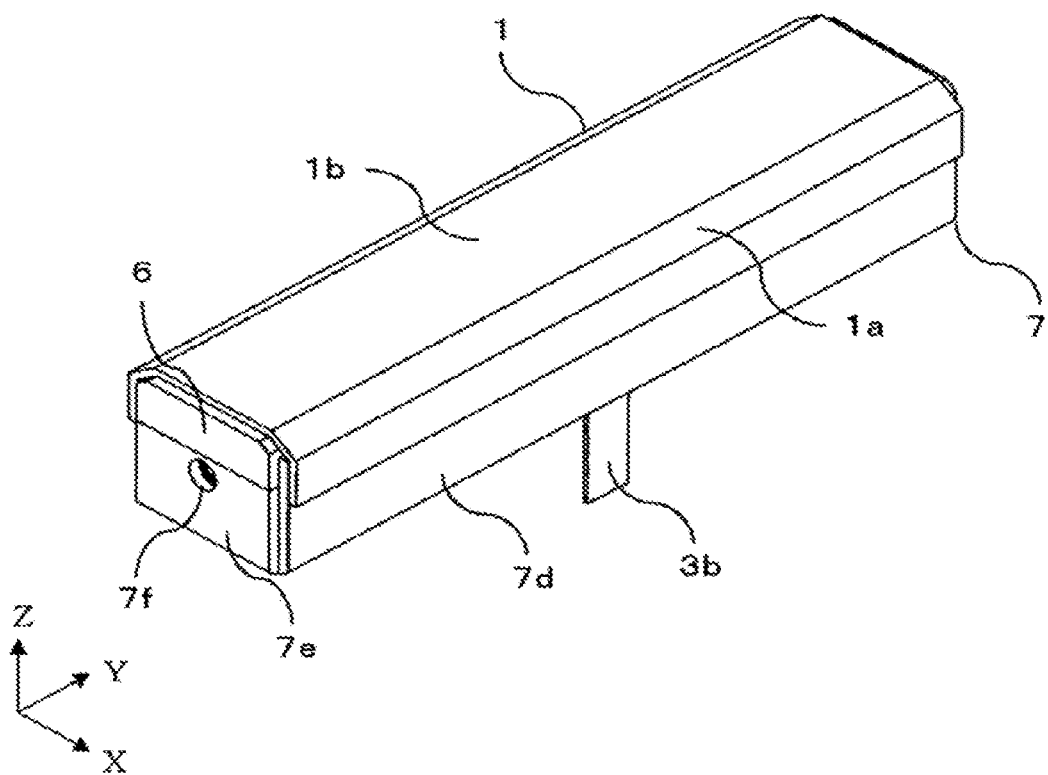
FIG. 12A is a perspective view of a magnetic sensor device according to Embodiment 3 of the present disclosure.
Figure 12B:
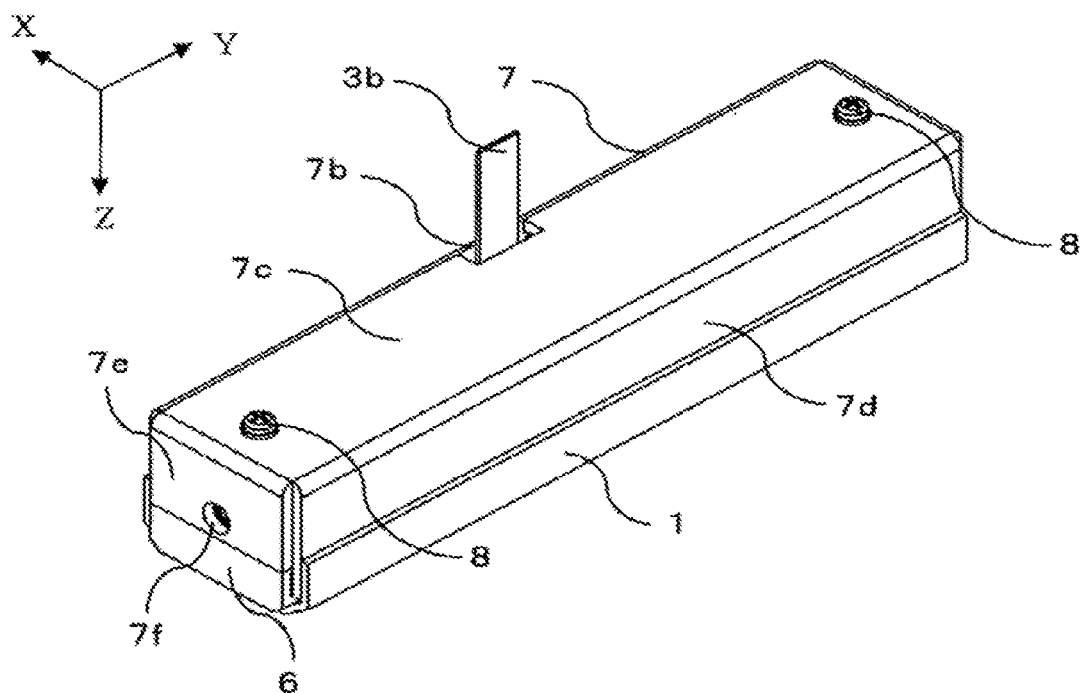
FIG. 12B is a perspective view of the magnetic sensor device according to Embodiment 3 of the present disclosure.
Figure 13:
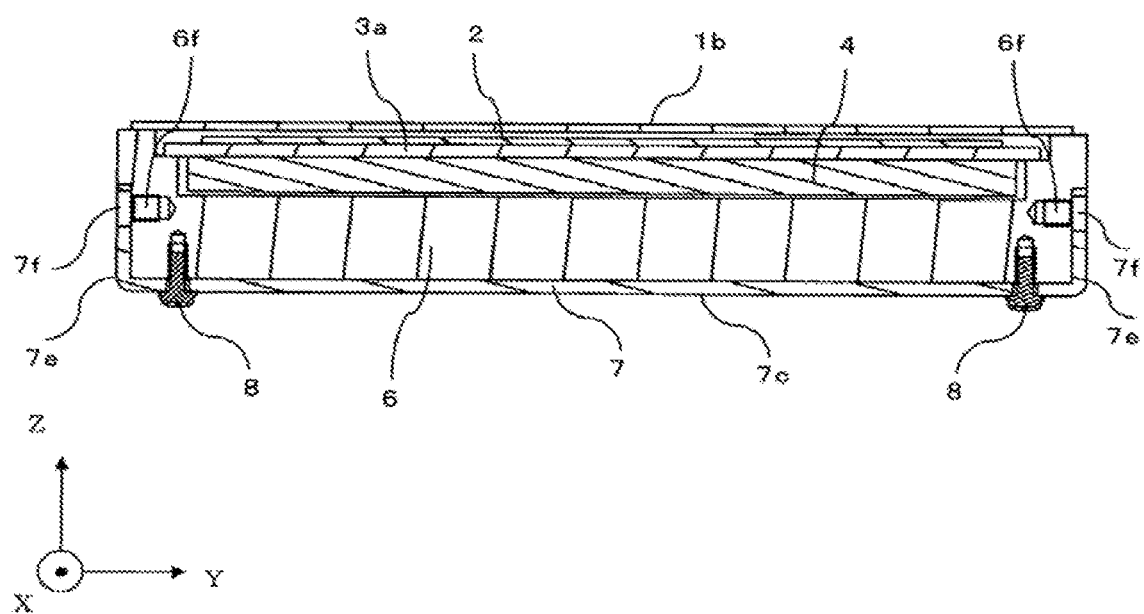
FIG. 13 is a cross-sectional view of the magnetic sensor device according to Embodiment 3 of the present disclosure taken along the YZ plane.
Figure 14A:
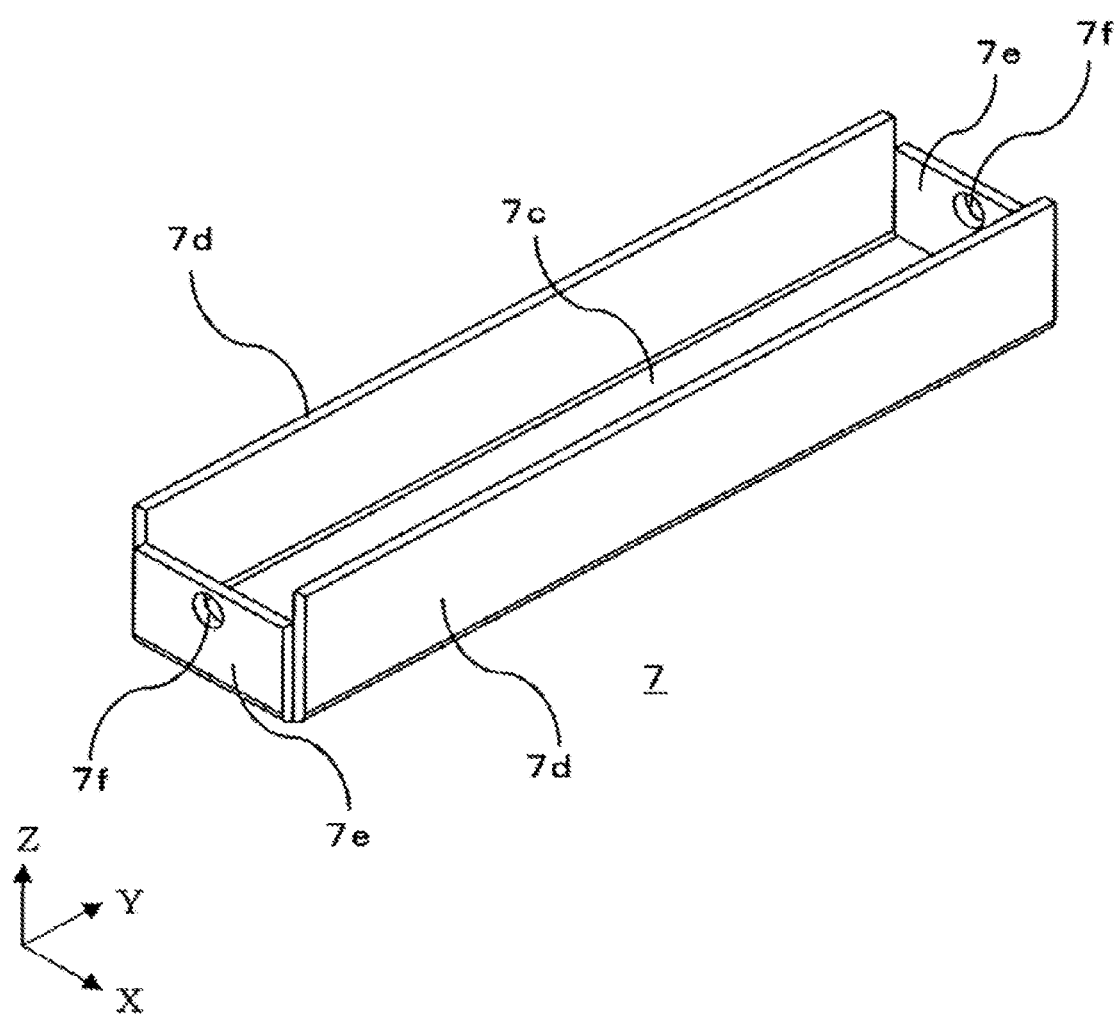
FIG. 14A is a perspective view of a magnetic shield in the magnetic sensor device according to Embodiment 3 of the present disclosure.
Figure 14B:
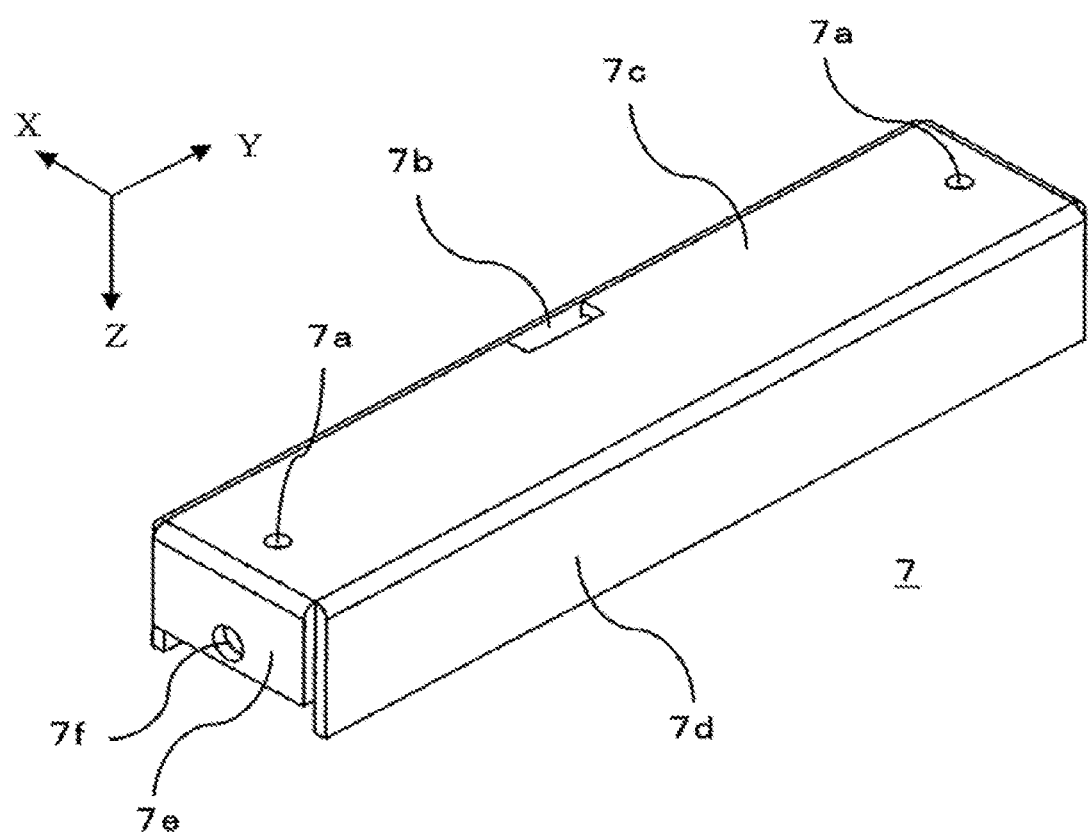
FIG. 14B is a perspective view of the magnetic shield in the magnetic sensor device according to Embodiment 3 of the present disclosure.
Figure 15A:
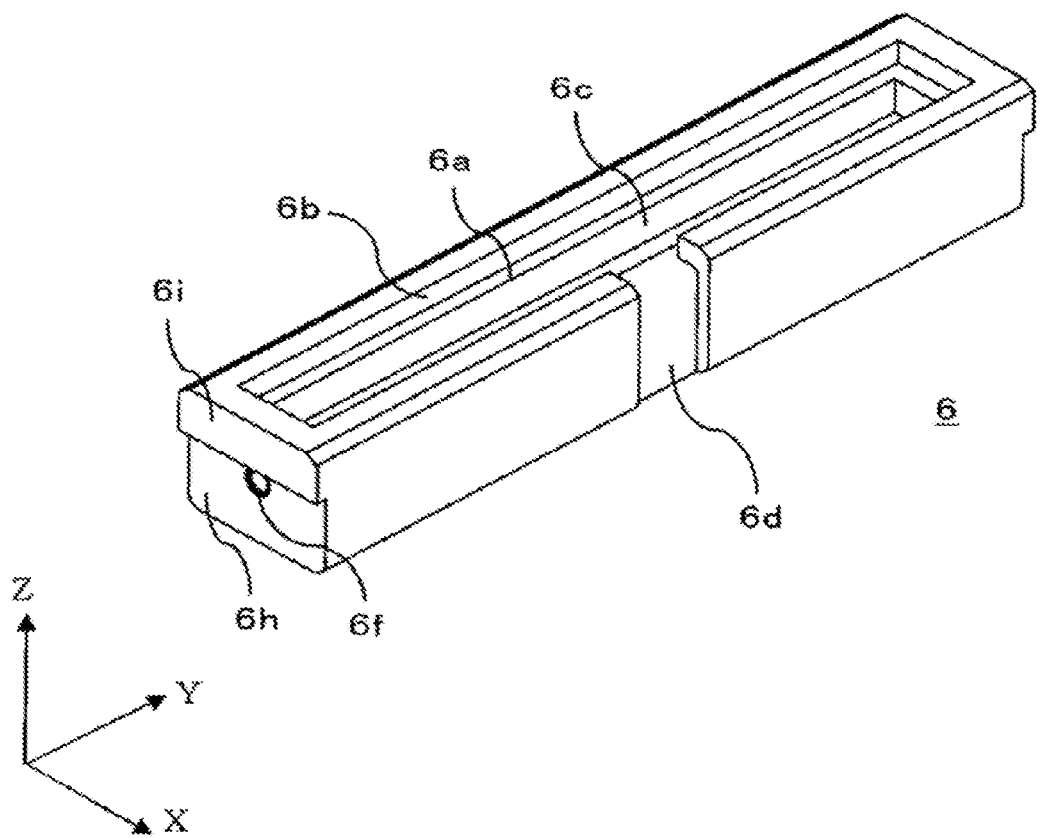
FIG. 15A is a perspective view of a case in the magnetic sensor device according to Embodiment 3 of the present disclosure.
Figure 15B:
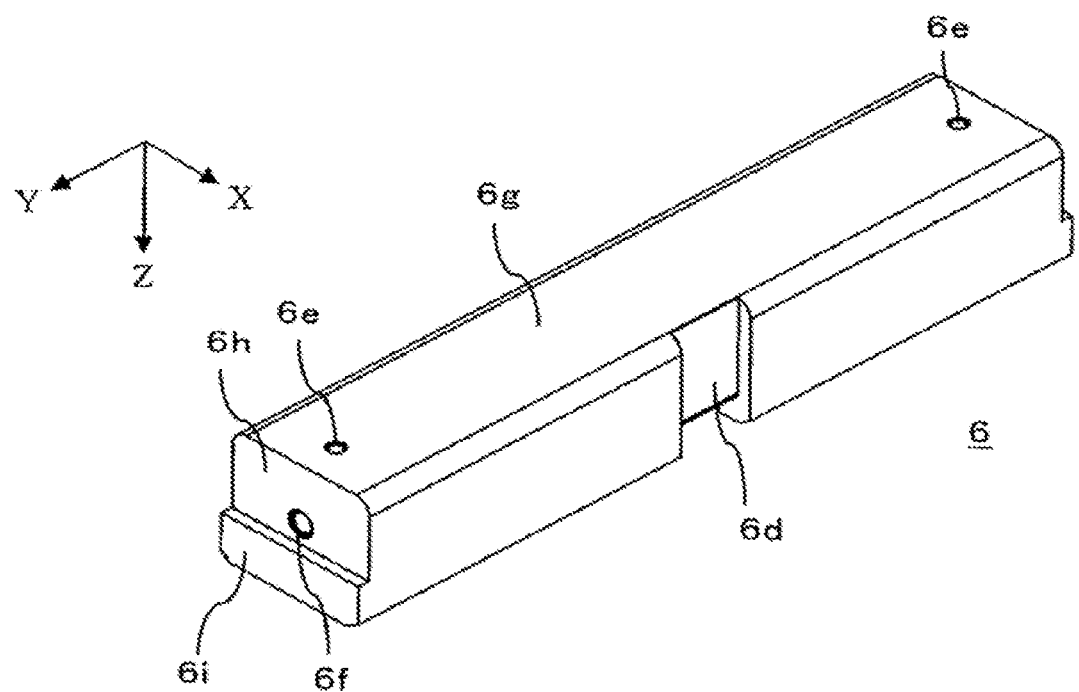
FIG. 15B is a perspective view of the case in the magnetic sensor device according to Embodiment 3 of the present disclosure.

A magnetic sensor device according to Embodiment 3 of the present disclosure is described below with reference to the accompanying drawings. FIG. 12 (FIGS. 12A and 12B) is a perspective view of the magnetic sensor device according to Embodiment 3 of the present disclosure. FIG. 13 is a cross-sectional view of the magnetic sensor device according to Embodiment 3 of the present disclosure taken along the YZ plane. FIG. 14 (FIGS. 14A and 14B) is a perspective view of the magnetic shield in the magnetic sensor device according to Embodiment 3 of the present disclosure. FIG. 15 (FIGS. 15A and 15B) is a perspective view of the case in the magnetic sensor device according to Embodiment 3 of the present disclosure. In FIGS. 12 to 15, the components identical or corresponding to those in FIGS. 1 to 11 are assigned the same reference characters, and further description of such components is omitted.

In Embodiment 2, the pair of second side walls 7e of the magnetic shield 7 cover substantially the entire side surfaces of the case 6 that face the Y-axis direction (the scanning-transverse direction or longitudinal direction). If the ends of the permanent magnet 4 in the Y-axis direction (the scanning-transverse direction or longitudinal direction) are close to the second side walls 7e of the magnetic shield 7, which is formed of a magnetic material, the magnetic field of the ends of the permanent magnet 4 in the Y-axis direction (the scanning-transverse direction or longitudinal direction) is drawn toward the directions of the second side walls 7e of the magnetic shield 7, thereby disturbing the bias magnetic field of the ends of the permanent magnet 4 in the Y-axis direction (the scanning transverse direction or longitudinal direction).

Although in Embodiment 3 there is somewhat of a lessening in noninterference with respect to variation in the magnetic field in the Y-axis direction (the scanning-transverse direction or longitudinal direction) of the magnetic sensor device, length of the pair of second side walls 7e of the magnetic shield 7 in the Z-axis direction (the height direction) is shorter than length of the pair of second side walls 7e of the magnetic shield 7 in the Z-axis direction (the height direction) in Embodiment 2. Specifically, as illustrated in FIG. 13, the ends of the pair of second side walls 7e of the magnetic shield 7 in the Z-axis direction (the height direction), that is, the ends of the pair of second side walls 7e of the magnetic shield 7 on the side adjacent to the sensor substrate 3 are located at substantially the same position as the surface of the permanent magnet 4 opposite to the surface facing the sensor substrate 3.

The ends of the pair of second side walls 7e of the magnetic shield 7 in the Z-axis direction (the height direction) are thus distant from the surface of the permanent magnet 4 to which the sensor substrate 3 is fixed, thereby reducing the magnetic connection of the ends with the magnetic pole on the surface of the permanent magnet 4 to which the sensor substrate 3 is fixed. The magnetic pole on the surface of the permanent magnet 4 to which the sensor substrate 3 is fixed forms a bias magnetic field. Thus a magnetic sensor device is obtained that is capable of stable detection of a magnetic pattern of the detection target 9 without disturbing the bias magnetic field of the ends of the permanent magnet 4 in the Y-axis direction (the scanning-transverse direction or longitudinal direction).

As described above, the pair of second side walls 7e of the magnetic shield 7 cover only part of the side surfaces of the case 6 that face the Y-axis direction (the scanning-transverse direction or longitudinal direction) in Embodiment 3. As illustrated in FIG. 15, each of the end surfaces of the case 6 that face the Y-axis direction (the scanning-transverse direction or longitudinal direction) includes a first end surface 6h and a second end surface 6i in Embodiment 3. The first end surfaces 6h are arranged standing from a bottom 6g, which is disposed opposite to the upper opening 6b, toward the positive side in the Z-axis direction (the side adjacent to the transport path). The ends of the first end surfaces 6h in the Z-axis direction (the height direction) are located at substantially the same position as the surface of the permanent magnet 4 opposite to the surface provided with the sensor substrate 3 (3a). The second end surfaces 6i protrude from the respective first end surfaces 6h outward in the Y-axis direction (the scanning-transverse direction or longitudinal direction) at substantially the same position as the surface of the permanent magnet 4 opposite to the surface provided with the sensor substrate 3 (3a). The second end surfaces 6i extend from the respective first end surfaces 6h to the surface attached to the cover 1 in the Z-axis direction (the height direction). The length of the protrusions of the second end surfaces 6i in the Y-axis direction (the scanning-transverse direction or longitudinal direction) is equal to the thickness of the side walls 7e of the magnetic shield 7. Due to configuration of the case 6 in this manner, fixing of the magnetic shield 7 to the case 6 enables obtaining of a magnetic sensor device that has no protrusions.

REFERENCE SIGNS LIST

1 Cover
1a Slant surface
b Detection target transport surface
2 Magnetic-resistance-effect-element mounted body
3 Sensor substrate (magnetic-resistance-effect-element mounted substrate)
3a Mounted portion
3b External connector
4 Permanent magnet (magnet)
5 Wire
6 Case
6a Step
6b Opening
6c Opening
6d Groove
6e Magnetic-shield attachment hole
6f External connection part
6g Bottom
6h First end surface
6i Second end surface
7 Magnetic shield
7a Attachment hole
7b Hole
7c Bottom
7d Side wall
7e Side wall (second side wall)
7f Through hole
8 Screw (fastener)
9 Detection target
10 Transport direction
11 Magnetic flux

The invention claimed is:

1. A magnetic sensor device comprising:
a magnet;
a substrate including a magnetic-resistance-effect-element mounted body mounted on a surface thereof opposite to a surface thereof facing the magnet, the magnetic-resistance-effect-element mounted body formed along a longitudinal direction of the magnet;
a case that accommodates or retains the magnet and the substrate; and
a magnetic shield to cover the case except for the surface of the substrate on which the magnetic-resistance-effect-element mounted body is mounted, wherein the magnetic shield comprises:
a bottom that faces a surface of the case, the surface being disposed to oppose the substrate across the magnet, and
side walls standing from the bottom toward a side adjacent to the substrate, the side walls being spaced from each other in a transverse direction intersecting the longitudinal direction, the side walls extending in the longitudinal direction of the magnet, and
the side walls have ends on the side adjacent to the substrate, the ends being located between a position of a surface where the substrate opposes the magnet and a position of a surface where the magnetic-resistance-effect-element mounted body is mounted on the substrate.

2. The magnetic sensor device according to claim wherein the magnetic shield further comprises:
second side walls standing from the bottom toward the side adjacent to the substrate, the second side walls being spaced from each other in the longitudinal direction, the second side walls extending in the transverse direction, and
the second side walls have ends on the side adjacent to the substrate, the ends being located between a position of a surface where the substrate opposes the magnet and a position of a surface where the magnetic-resistance-effect-element mounted body is mounted on the substrate.

3. The magnetic sensor device according to claim wherein the magnetic shield further comprises:
second side walls standing from the bottom toward the side adjacent to the substrate, the second side walls being spaced from each other in the longitudinal direction, the second side walls extending in the transverse direction, and
the second side walls have ends on the side adjacent to the magnetic-resistance-effect-element mounted substrate, the ends being located at a same position as a surface of the magnet opposite to a surface facing the magnetic-resistance-effect-element mounted substrate.

4. A magnetic sensor device comprising:
a magnet;
a substrate including a magnetic-resistance-effect-element mounted body mounted on a surface thereof opposite to a surface thereof facing the magnet, the magnetic-resistance-effect-element mounted body extending in a longitudinal direction of the magnet;
a case that accommodates or retains the magnet and the substrate; and
a magnetic shield to cover the case except for the surface of the substrate can which the magnetic-resistance-effect-element mounted body is mounted, wherein the magnetic shield comprises:
a bottom that faces a surface of the case, the surface being disposed so as to oppose the substrate across the magnet, and
side walls standing from the bottom toward a side adjacent to the substrate, the side walls being spaced from each other in a transverse direction intersecting the longitudinal direction, the side walls extending in the longitudinal direction of the magnet, and
second side walls standing from the bottom toward the side adjacent to the substrate, the second side walls being spaced from each other in the longitudinal direction, the second side walls extending in the transverse direction, the side walls have ends on the side adjacent to the substrate, the ends being located at a same position as the surface of the magnetic substrate facing the magnet or extending more distant from the magnet than the surface of the substrate facing the magnet, and the second side walls have ends on the side adjacent to the substrate, the ends being located at a same position as a surface of the magnet opposite to a surface facing the substrate.

5. The magnetic sensor device according to claim 1, further comprising:

a cover of a non-magnetic material, the cover covering the surface of the substrate on which the magnetic-resistance-effect-element mounted body is mounted, the cover being in contact with the ends of the side walls on the side adjacent to the substrate.

6. The magnetic sensor device according to claim 2, further comprising:

a cover of a non-magnetic material, the cover covering the surface of the substrate on which the magnetic-resistance-effect-element mounted body is mounted, wherein the cover is in contact with the ends of the side walls on the side adjacent to the substrate, and the cover is in contact with the ends of the second side walls on the side adjacent to the substrate.

7. The magnetic sensor device according to claim wherein the case is formed of an electrically conductive material, the magnetic shield is formed of an electrically conductive magnetic material, the case is electrically connected to the magnetic shield, and the case is grounded.

8. The magnetic sensor device according to claim 1, wherein the substrate is a resin substrate on which the magnetic-resistance-effect-element mounted body is mounted.

9. The magnetic sensor device according to claim 1, wherein the substrate is a metal carrier on which the magnetic-resistance-effect-element mounted body is mounted.

10. The magnetic sensor device according to claim 4, further comprising:

a cover formed of a non-magnetic material, the cover covering the surface of the substrate on which the magnetic-resistance-effect-element mounted body is mounted, the cover being in contact with the ends of the side walls on the side adjacent to the substrate.

11. The magnetic sensor device according to claim 4, further comprising:

a cover of a non-magnetic material, the cover covering, the surface of the substrate on which the magnetic-resistance-effect-element mounted body is mounted, wherein the cover is in contact with the ends of the side wall on the side adjacent to the substrate, and the cover is in contact with the ends of the second side walls on the side adjacent to the substrate.

12. The magnetic sensor device according to claim 4, wherein the case is formed of an electrically conductive material, the magnetic shield is formed of an electrically conductive magnetic material, the case is electrically connected to the magnetic shield, and the case is grounded.

13. The magnetic sensor device according to claim 4, wherein the substrate is a resin substrate on which the magnetic-resistance effect-element mounted body is mounted.

14. The magnetic sensor device according to claim 4, wherein the substrate is a metal carrier on which the magnetic-resistance-effect-element mounted body is mounted.

15. The magnetic sensor device according to claim 2, wherein the case is formed of an electrically conductive material, the magnetic shield is formed of an electrically conductive magnetic material, the case is electrically connected to the magnetic shield, and the case is grounded.

16. The magnetic sensor device according to claim 2, wherein the substrate is a resin substrate on which the magnetic-resistance-effect-element mounted body is mounted.

17. The magnetic sensor device according to claim 2, wherein the substrate is a metal carrier on which the magnetic-resistance-effect-element mounted body is mounted.

* * * * *